United States Patent [19]
Toda

[11] Patent Number: 5,610,872
[45] Date of Patent: Mar. 11, 1997

[54] MULTI-BANK SYNCHRONOUS MEMORY SYSTEM WITH CASCADE-TYPE MEMORY CELL STRUCTURE

[75] Inventor: Haruki Toda, Yokohama, Japan

[73] Assignee: Kabushiki Kaisha Toshiba, Tokyo, Japan

[21] Appl. No.: 390,551

[22] Filed: Feb. 17, 1995

[30] Foreign Application Priority Data

Feb. 17, 1994 [JP] Japan .................................. 6-020329

[51] Int. Cl.$^6$ .................................................. G11C 8/00
[52] U.S. Cl. .............................. 365/230.06; 365/189.11; 365/226
[58] Field of Search ............................. 365/230.06, 226, 365/189.11, 203, 230.08; 326/105, 121

[56] References Cited

U.S. PATENT DOCUMENTS

| | | | |
|---|---|---|---|
| 5,282,171 | 1/1994 | Tokami et al. | 365/230.01 |
| 5,287,312 | 2/1994 | Okamura et al. | 365/201 |
| 5,371,697 | 12/1994 | Yamada | 365/230.06 X |
| 5,463,592 | 10/1995 | Ishikawa | 365/230.06 |

*Primary Examiner*—David C. Nelms
*Assistant Examiner*—Son Dinh
*Attorney, Agent, or Firm*—Loeb & Loeb LLP

[57] ABSTRACT

A synchronous memory system with a cascade-type memory cell structure has memory cells having a cascade type construction (or NAND type configuration), a row decoder, save registers, a sense amplifier, and a selector. The selector transmits a control signal to halt a sense operation for the memory cells when the sense operation for a target memory cell to be accessed is completed. The row decoder includes a decoder for decoding a row address, a latch circuit, a word line driver. The latch circuit stores a result of a decode operation, and the word line driver comprises a PMOS transistor and a NMOS transistor connected in series. A 8 volt power ($V_{pp}$) is supplied to the PMOS transistor in the word line driver.

32 Claims, 25 Drawing Sheets

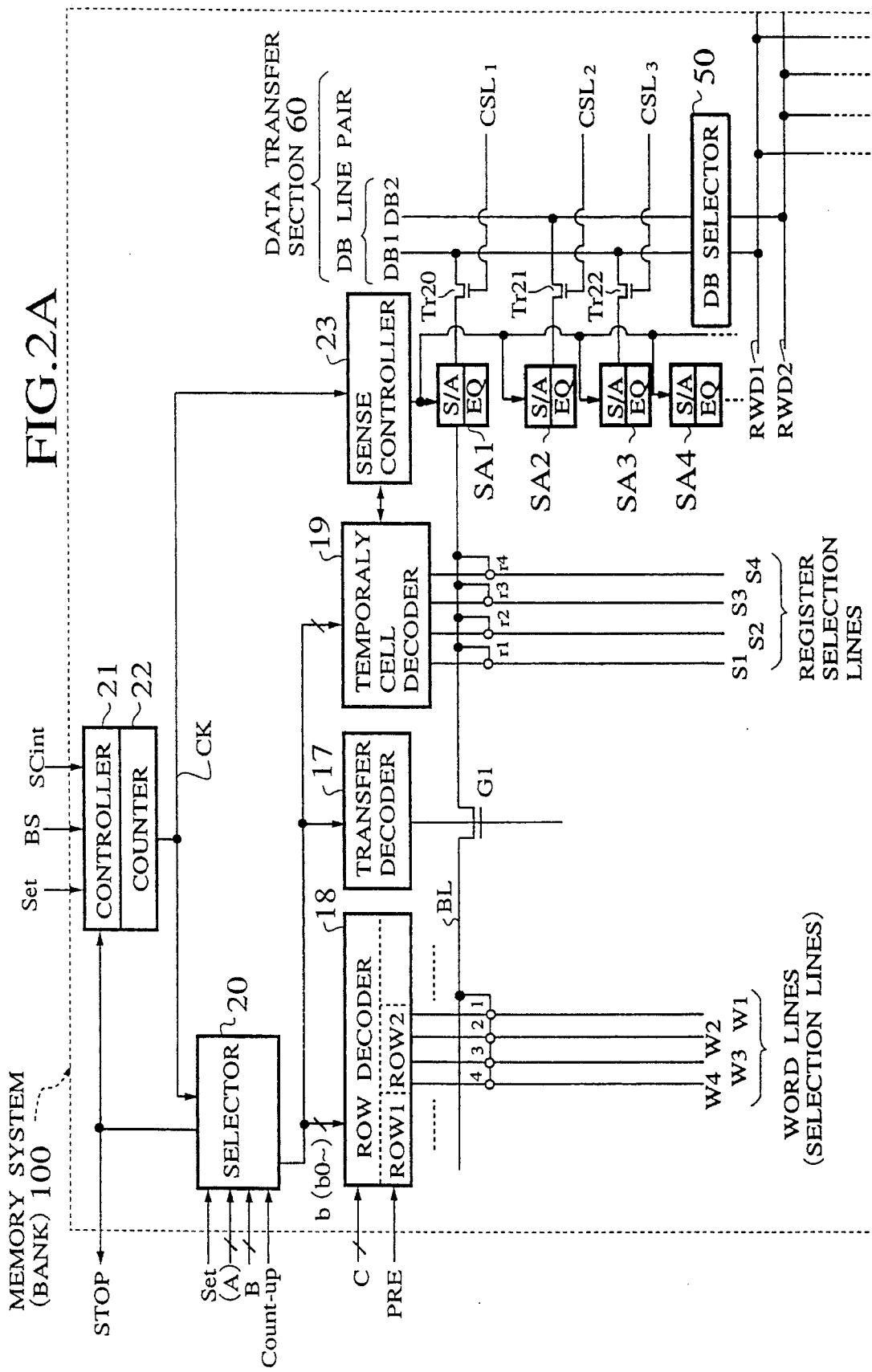

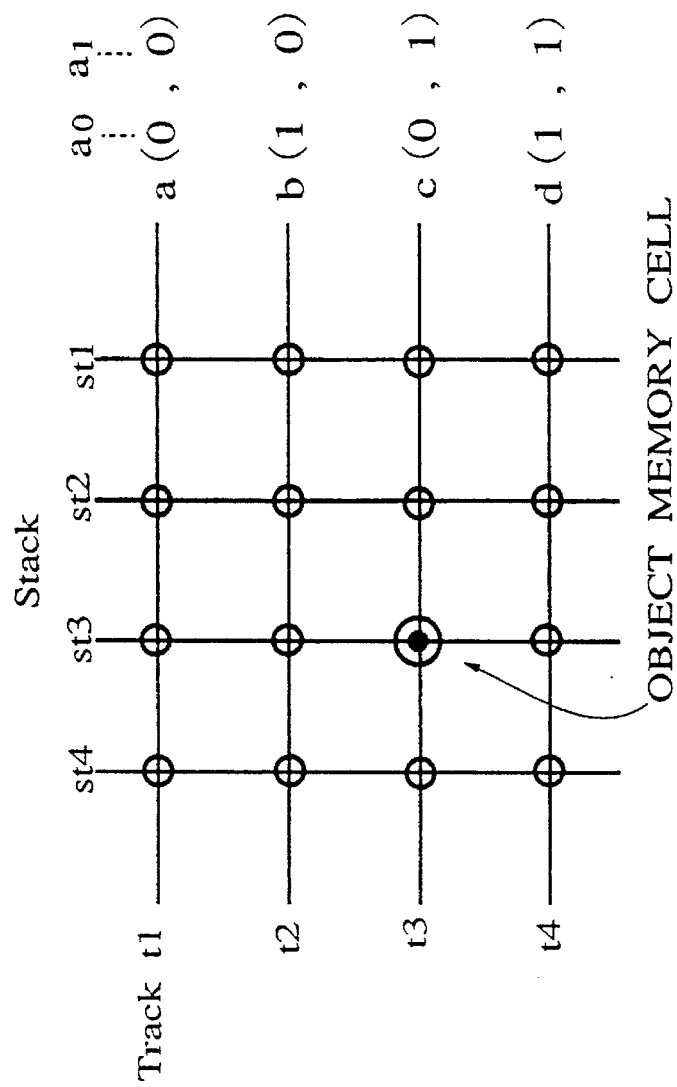
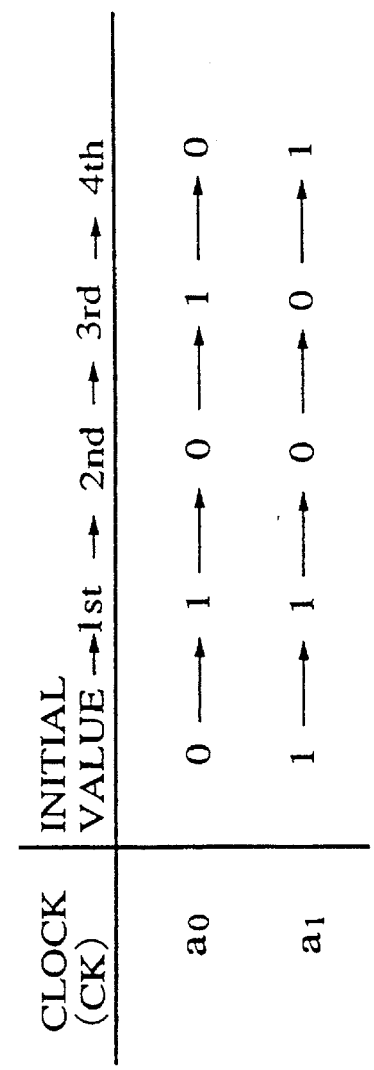
FIG.11

5,610,872

MULTI-BANK SYNCHRONOUS MEMORY SYSTEM WITH CASCADE-TYPE MEMORY CELL STRUCTURE

BACKGROUND OF THE INVENTION

1. Field of the Invention

The present invention relates to a large volume memory system, or, in more detail, a memory system without a mechanical operation section such as a magnetic disk memory, which, furthermore, is capable of providing high speed data transmission, and, in particular, to a memory system with a cascade-type cell structure which is a memory system of greatest volume for use in image processing.

2. Description of the Prior Art

Efforts for improving micromachining technology to upgrade storage capacity (degree of integration) of semiconductor memory chips are continuing, but there is a tendency for processing technology to become more and more complicated and for production costs to increase.

In order to eliminate these drawbacks, consideration is being given to memory systems with an improved degree of integration (wherein many memory cells can be formed within a chip), with the processing technology remaining at the conventional level.

A conventional memory cell with this configuration is referred to as a cascade-type or a NAND cell type because a memory cell and a data transfer gate are normally used in parallel.

A memory cells of the cascade-gate-type cell (CGC) structure has a plurality of capacitors for storing data items and a plurality of MOS transistors. Each capacitor is located between each adjacent transistor pair for storing data. Each MOS transistor (a gate) is connected to each word line. A predetermined number of capacitors are connected in series and one end of the capacitors is connected to a bit line. The predetermined number of the capacitors are divided into a memory cell group. The memory cell group is called as the memory cell having the cascade-gate-type cell structure.

A memory cell structure in this type of memory system is hereinafter referred to as "cascade-type cell structure".

A memory system formed from memory cells with this cascade-type cell structure has the special feature of improved density of memory cells (degree of integration) whereby it is possible to arrange and localize the grouping of a specified number of memory cells within a chip. Accordingly, it is possible to provide a memory system with the same degree of integration (memory volume) as a memory cell of a structure wherein the memory cells and data transfer gates are consolidated, in about 60% of the area.

Next, the sense operation and restore operation will be explained for data in a conventional memory system with a cascade-type cell structure.

in FIG. 1, four word lines W1, W2, W3, W4 are provided as gates for reading out memory cell data to a bit line Bi for sixteen memory cells (141, 142, . . . , 1416), connected in a cascade configuration. The word lines (W1, W2, W3, W4) are opened (activated) successively from the side near to the bit line Bi. For example, when the word line W1 is activated the four memory cells (141, 142, 143, 144) are accessed in order and a reading or writing operation is performed for the data.

Data which has been read out of the memory cell must be temporarily stored in some location until the data is restored to that memory cell. For the reason, restore registers( r1, r2, r3, r4) are provided to store the data.

A data store operation and a refresh operation for the memory cell are carried out in the reverse order to the order in which the memory cell data is temporarily written into and read out of the restore register, by rewriting the data once again into that memory cell.

In the conventional memory system with a cascade-type cell structure shown in FIG. 1, sense amplifiers (S/A) are provided in the ratio of one to every four bit lines (b1, b2, b3, b4) to repeat the arrangement of the sense amplifiers (S/A) and to relive congestion of the pitch.

For this reason, selection transfer gates (G1 G2, G3, G4) are provided to select which memory cell group in one group of memory cell arrays (for example, the memory cells 141, 145, 149, 1413 are respectively cascade-connected and form one group) is to be connected to the sense amplifier (S/A).

Accordingly, sixteen memory cells (141, 142, . . . , 1416) can be considered as one lot in the memory cell read-out operation and the restore operation.

For example, when the data is read out of the deepest (furthest back) memory cell (for example, among the four cascade connected memory cells 141, 145, 149, 1413, the memory cell 1413 is the deepest), the data in the memory cells 141, 145, 149 is destroyed. Accordingly, prior to destruction, all the data in these memory cells must be sensed and that data temporarily saved in a restore register.

Next, after the data in the memory cell 1413 is read out, a restore operation must be performed for the memory cells 141, 145, 149 corresponding to the data temporarily saved in the restore register. This restore operation is identical to the read-out operation inasmuch as the data stored in the register is sensed and the result is transferred to the corresponding memory cell. Specifically, the word lines W1, W2, W3, W4 are activated in the opposite order to the read-out.

Accordingly, there is the problem in the conventional read-out operation of the cascade-type synchronous memory cell that the amount of time required for data transmission during a read-out operation in the cascade-type memory cell changes according to which memory cell the data is read from, because the number of sensing operations differs. In other words, there is a difference in the required number of sensing operations before the read-out from the memory cell to be accessed is started.

For this reason, there is the problem that the time necessary for data transmission to each memory cell changes. In this manner, in a conventional memory system with a cascade-type cell structure, there is a wide variation in the amount of time necessary for each data transmission so there is the problem that data access control is complicated. However, on the other hand, there is the advantage that the production cost of a memory cell with a cascade-type configuration is low, therefore a memory system giving these special features must be provided.

In addition, in a conventional memory system with a cascade-type cell structure, the control clock signal for supplying an address and the control clock signal for transmitting data from the memory cell to an external destination are separate signals. For this reason, there is the problem that control of the timing of the operation is complicated. In addition, a microprocessor (a CPU or the like) must supervise the timing until a row selection signal (RAS) is entered and data transmission from the memory cell is commenced. During this time the CPU cannot perform another process, resulting in poor efficiency.

SUMMARY OF THE INVENTION

Accordingly, an object of the present invention is, with due consideration to the drawbacks of such a conventional memory system with a cascade-type cell structure, to provide a memory system which can implement one series of data access operations for entering an address signal with good efficiency, synchronous with a clock signal; to provide a memory system with a cascade-type cell structure wherein it is unnecessary to supervise input/output operations with a CPU or the like, after an address has been entered; to provide a memory system with a cascade-type cell structure wherein it is possible to improve the degree of integration of the memory cells (area capacity of the memory cells) and to reduce the cost of production, which are the special features of the cascade-type cell structure; and, in addition, to provide a multi-bank memory system with a cascade-type cell structure wherein there is no perception of an increase in variation in access time even though there is a wide variation in the amount of time to access each memory cell.

In order to solve the conventional problems described above, the invention provides a synchronous memory system with a cascade-type memory cell structure for receiving address signals for a memory cell to be accessed and reading out of data stored in the memory cell being performed in synchronization with a first clock signal supplied from an external device, the synchronous memory system comprising:

a plurality of bit lines;

a plurality of memory cells having a cascade-type configuration connected to each of the plurality of bit lines;

a plurality of word lines connected to the plurality of memory cells; and a row decoder comprising:

a plurality of first decode circuits for receiving a first row address signal and decoding the first row address signal and generating a first drive control signal, each first decode circuit comprising a first PMOS precharging transistor and first NMOS discharging transistors connected in series;

a plurality of word line drive units for receiving the first drive control signal and providing a first drive signal to the plurality of word lines, each first drive unit having a first PMOS transistor and a first NMOS transistor connected in series, an intermediate node between the first PMOS transistor and the first NMOS transistor belonging to one the plurality of word lines; and a voltage generation circuit for receiving a first voltage and a second row address signal, and generating second drive signals and providing the second drive signals to the first PMOS transistor of each of the plurality of word line drive units according to the second row address signal.

In the synchronous memory system with a cascade-type memory cell structure just described, the voltage generation circuit comprises a plurality of second decode circuits, a plurality of second drive units, a plurality of first inverters, and a second voltage generation circuit, wherein the second voltage generation circuit receives the first voltage and boosts up the first voltage to the second voltage, the plurality of second decode circuits receive the second row address signal, generate a second drive control signal, and provide the second drive control signal to the plurality of second drive units, each of the plurality of second decode circuits comprises a second PMOS precharging transistor and second NMOS discharging transistors connected in series, a source of the second precharging transistor is connected to the second voltage provided from the second voltage generation circuit, the plurality of second drive units receive the second drive control signal and supply the second drive signals to the first PMOS transistors in the plurality of word line drive units, each second drive unit has a second PMOS transistor whose source being connected to the second voltage provided from the second voltage generation circuit and a second NMOS transistor connected in series, an intermediate node between the second PMOS transistor and the second NMOS transistor in each second drive unit is connected to the first inverter, and each of the plurality of first inverters receives the second drive signal and generates a third drive signal, each first inverter is driven based on the first voltage.

In the synchronous memory system with a cascade-type memory cell structure just described, the row decoder further comprises a plurality of third NMOS transistors, a source of each third NMOS transistor is connected to each word line, a gate of each third NMOS transistor is connected to each of the plurality of first inverters.

In the synchronous memory system with a cascade-type memory cell structure just described, a voltage potential of the first is smaller than a voltage potential of the second voltage.

As another preferred embodiment of the present invention, a synchronous memory system with a cascade-type memory cell structure for receiving address signals for a memory cell to be accessed and reading out of data stored in the memory cell being performed in synchronization with a first clock signal supplied from an external device, the synchronous memory system comprising:

a plurality of bit lines;

a plurality of memory cells having a cascade-type configuration connected to each of the plurality of bit lines;

a plurality of word lines connected to the plurality of memory cells; and a row decoder comprising:

a plurality of first decode circuits for receiving a first row address signal and decoding the first row address signal and generating a first drive control signal, each first decode circuit comprising a first PMOS precharging transistor and first NMOS discharging transistors connected in series;

a plurality of word line drive units for receiving the first drive control signal and providing a first drive signal to the plurality of word lines, each first drive unit having a first NMOS transistor and a second NMOS transistor connected in series, an intermediate node between the first NMOS transistor and the second NMOS transistor belonging to one the plurality of word lines;

a plurality of first flip/flop circuits (F/Fs) for storing the first drive control signal, each first F/F being located between each first decode circuit and each word line drive unit, each first F/F comprising second and third inverters connected in series, each first F/F being driven by the first voltage;

a plurality of fourth inverters, each fourth inverter placed between each first F/F and each word line drive unit, each fourth inverter driven by the first voltage; and a voltage generation circuit for receiving a first voltage and a second row address signal, and generating second drive signals and providing the second drive signals to the first NMOS transistor of each of the plurality of word line drive units according to the second row address signal.

In the synchronous memory system with a cascade-type memory cell structure just described, the voltage generation circuit comprises a plurality of second decode circuits, a plurality of second flip/flop circuits (F/Fs), a plurality of seventh inverters, a plurality of second drive units, a plurality of first inverters, and a second voltage generation circuit;

wherein the second voltage generation circuit receives the first voltage and boosts up the first voltage to the second voltage, the plurality of second decode circuits receive the second row address signal, generate a second drive control signal, and provide the second drive control signal to the plurality of second drive units, each of the plurality of second decode circuits comprises a second PMOS precharging transistor and second NMOS discharging transistors connected in series, a source of the second precharging transistor is connected to the second voltage provided from the second voltage generation circuit, the plurality of second flip/flop circuits (F/Fs) located between each second decode circuit and the second drive unit, each second F/F comprises fifth and sixth inverters connected in series, each second F/F being driven by the first voltage;

the plurality of seventh inverters, each seventh inverter located between each second F/F and each second drive unit, each seventh inverter driven by the first voltage; and the plurality of second drive units receive the second drive control signal and supply the second drive signals to the first NMOS transistors in the plurality of word line drive units, each second drive unit has a third NMOS transistor whose source being connected to the first voltage provided from the second voltage generation circuit and a fourth NMOS transistor connected in series, an intermediate node between the third NMOS transistor and the fourth NMOS transistor in each second drive unit is connected to the first inverter, and each of the plurality of first inverters receives the second drive signal and generates a third drive signal, each first inverter is driven based on the first voltage.

In the synchronous memory system with a cascade-type memory cell structure just described, the row decoder further comprises a plurality of fifth NMOS transistors, a source of each fifth NMOS transistor is connected to each word line, a gate of each fifth NMOS transistor is connected to each of the plurality of first inverters.

In the synchronous memory system with a cascade-type memory cell structure just described, a voltage potential of the first voltage is smaller than a voltage potential of the second voltage.

As another preferred embodiment of the present invention, a synchronous memory system with a cascade-type memory cell structure for receiving address signals for a memory cell to be accessed and reading out of data stored in the memory cell being performed in synchronization with a first clock signal supplied from an external device, the synchronous memory system comprising:

a plurality of bit lines;

a plurality of memory cells having a cascade-type configuration connected to each of the plurality of bit lines;

a plurality of word lines connected to the plurality of memory cells; and a row decoder comprising:

a plurality of first decode circuits for receiving a first row address signal and decoding the first row address signal and generating a first drive control signal, each first decode circuit comprising a first PMOS precharging transistor and first NMOS discharging transistors connected in series;

a plurality of first flip/flop circuits (F/Fs) for storing the first drive control signal, each first F/F being located between each first decode circuit and each word line drive unit, each first F/F comprising second and third inverters connected in series;

a plurality of fourth inverters, each fourth inverter placed between each first F/F and each word line drive unit; and a plurality of word line drive units for receiving the first drive control signal and providing a first drive signal to the plurality of word lines, each first drive unit having a first PMOS transistor and a first NMOS transistor connected in series, an intermediate node between the first PMOS transistor and the first NMOS transistor belonging to one the plurality of word lines; and a voltage generation circuit for receiving a first voltage and a second row address signal, generating second drive signals and providing the second drive signals to the first PMOS transistor of each of the plurality of word line drive units according to the second row address signal, and boosting up the first voltage to a second voltage, wherein the first PMOS precharging transistor in each first decode circuit, the second and third inverters in each first F/F, each fourth inverter are driven by the second voltage.

In the synchronous memory system with a cascade-type memory cell structure just described, the voltage generation circuit comprises a plurality of second decode circuits, a plurality of second flip/flop circuits (F/Fs), a plurality of seventh inverters, a plurality of second drive units, a plurality of first inverters, and a second voltage generation circuit, wherein the second voltage generation circuit receives the first voltage and boosts up the first voltage to the second voltage, the plurality of second decode circuits receive the second row address signal, generate a second drive control signal, and provide the second drive control signal to the plurality of second drive units, each of the plurality of second decode circuits comprises a second PMOS precharging transistor and second NMOS discharging transistors connected in series, a source of the second precharging transistor is connected to the second voltage provided from the second voltage generation circuit, the plurality of second flip/flop circuits (F/Fs) located between each second decode circuit and the second drive unit, each second F/F comprises fifth and sixth inverters connected in series, each second F/F being driven by the second voltage;

the plurality of seventh inverters, each seventh inverter located between each second F/F and each second drive unit, each seventh inverter driven by the second voltage; and the plurality of second drive units receive the second drive control signal and supply the second drive signals to the first PMOS transistors in the plurality of word line drive units, each second drive unit has a second PMOS transistor whose source being connected to the second voltage provided from the second voltage generation circuit and a second NMOS transistor connected in series, an intermediate node between the second PMOS transistor and the second NMOS transistor in each second drive unit is connected to the first inverter, and each of the plurality of first inverters receives the second drive signal and generates a third drive signal, each first inverter is driven based on the first voltage.

In the synchronous memory system with a cascade-type memory cell structure just described, the row decoder further comprises a plurality of third NMOS transistors, a source of each third NMOS transistor is connected to each word line, a gate of each third NMOS transistor is connected to each of the plurality of first inverters.

In the synchronous memory system with a cascade-type memory cell structure just described, wherein a voltage potential of the first voltage is smaller than a voltage potential of the second voltage.

As another preferred embodiment of the present invention, a synchronous memory system with a cascade-type memory cell structure in which receiving of an address for a memory cell to be accessed and readout of data stored from the memory cell being performed in synchronization with a first clock signal supplied from an external device, the synchronous memory system comprising:

a plurality of word lines;
a plurality of bit lines;
a plurality of first memory cells having a cascade-type configuration connected to the plurality of word lines, the plurality of first memory cells forming a first memory cell group in a plurality of first memory cell group in a memory cell array, the first memory cell group being connected to one of the plurality of bit lines;
a sense amplifier for sensing data to be written into the plurality of first memory cells or for sensing data read out from the plurality of first memory cells;
a plurality of second memory cells provided corresponding to the plurality of first memory cells; and
a decoder for receiving an address signal for a target memory cell to be accessed in the plurality of first memory cells in order to perform a sense operation based on the first clock signal, and controlling a transmission of data stored in each of the plurality of first memory cells into each of the plurality of second memory cells in synchronism with a second clock signal generated by using the first clock signal.

The synchronous memory system with a cascade-type memory cell structure just described, further comprises a selector for generating a control signal to select each of the plurality of first memory cells including the target memory cell based on the address signal designating the target memory cell, transmitting the control signal to the decoder, and generating a stop signal in order to halt the sense operation for the plurality of first memory cells when the transmission of data stored in the target memory cell to the sense amplifier is completed, and transmits the stop signal to the decoder and external devices.

In the synchronous memory system with a cascade-type memory cells described above, the sense amplifier comprises a first type MOS transistor pair connected in series and a second type MOS transistor pair connected in series, the first type MOS transistor pair and the second type MOS transistor pair are connected to the bit selection line pair in parallel, both gates of the first type MOS transistor pair are connected to the bit selection line and both gates of the second type MOS transistor pair are connected to the bit selection line.

In the synchronous memory system with a cascade-type memory cell structure described above, the number of the plurality of first memory cells connected in the cascade-type configuration per first memory cell group is four first memory cells.

In the synchronous memory system with a cascade-type memory cells described above, the plurality of second memory cells comprises first to fourth cells, each cell comprises a capacitor and a MOS transistor, a source of the MOS transistor in the first cell is connected to a source of the MOS transistor in the second cell, a source of the MOS transistor in the third cell is connected to a source of the MOS transistor in the fourth cell, each source of the MOS transistor in the first to fourth cells is connected to each of the plurality of bit lines, each drain of the MOS transistor is connected to the capacitor in the first to fourth cells.

In the synchronous memory system with a cascade-type memory cells described above, the plurality of second memory cells comprises first to third cells, each cell comprises a capacitor and a MOS transistor, a source of the MOS transistor in the first cell is connected to a source of the MOS transistor in the second cell, each source of the MOS transistor in the first to third cells is connected to each of the plurality of bit lines, each drain of the MOS transistor is connected to the capacitor in the first to fourth cells.

In the synchronous memory system with a cascade-type memory cells described above, the plurality of second memory cells comprises first to fourth cells, each of the first to fourth cells comprises a first MOS transistor and a second MOS transistor connected in series, an intermediate point of the first MOS transistor and the second MOS transistor is connected to a flip/flop circuit (F/F), gates of the first MOS transistor and the second MOS transistor are connected to each of the plurality of bit lines.

In the synchronous memory system with a cascade-type memory cells described above, the plurality of second memory cells comprises four first memory cells connected to each other in the cascade-type structure, and one of the plurality of second memory cells located at a first end position is connected to one of the plurality of bit lines, and data items stored in the four first memory cells are saved into the second memory cells, a save operation is initiated from a second memory cell located at the opposite end position to the first end position in the second memory cells.

In the synchronous memory system with a cascade-type memory cells described above, the plurality of second memory cells comprises three first memory cells connected to each other in the cascade-type structure, and one of the plurality of second memory cells located at a first end position is connected to one of the plurality of bit lines, data items stored in the first memory cells are saved into the second memory cells, and a save operation is initiated from a second memory cell located at the opposite end position to the first end position in the second memory cells.

In the synchronous memory system with a cascade-type memory cells described above, the plurality of second memory cells comprises four first memory cells connected to each other in the cascade-type structure, and both ends of the plurality of first memory cells are connected to one of the plurality of bit lines, both ends of the plurality of second memory cells are connected to the bit line, and data items stored in the plurality of first memory cells are saved into the plurality of second memory cells cyclicly.

In the synchronous memory system with a cascade-type memory cells described above, the plurality of second memory cells comprises three cells each of which comprises a MOS transistor and a flip/flop circuit (F/F), a source of the MOS transistor is connected to each of the plurality of bit lines, and a drain of the MOS transistor is connected to the flip/flop.

As another preferred embodiment of the present invention, a synchronous memory system with a cascade-type memory cell structure in which receiving of an address for a memory cell to be accessed and readout of data stored from the memory cell being performed in synchronization with a first clock signal supplied externally, the synchronous memory system comprising:
a plurality of word lines;

a plurality of bit lines;

a plurality of first memory cells having a cascade-type configuration connected to the plurality of word lines, the plurality of first memory cells forming a memory cell group in a plurality of memory cell groups in a memory cell array, the memory cell group being connected to one of the plurality of bit lines;

a plurality of transfer gates provided to each of the plurality of the bit lines to connect each memory cell group to each of the plurality of the bit lines;

a sense amplifier connected to each of the plurality of bit lines for sensing data to be written into each of the plurality of first memory cells or for sensing data to be read out from each of the plurality of first memory cells;

an equalizer provided for the sense amplifier for equalizing a voltage potential of each of the plurality of bit lines;

a plurality of second memory cells located between the plurality of first memory cells and the sense amplifier, the plurality of second memory cells provided for the plurality of first memory cells;

a selector for receiving an address signal of a target memory cell to be accessed in the plurality of first memory cells according to the first clock signal, selecting each of the plurality of first memory cells while saving data of the selected each of the plurality of first memory cells to the plurality of second memory cells in synchronism with the first clock signal and counting a number of the selected each of the plurality of first memory cells, generating a sense operation halt control signal when the target memory cell being selected and whose data being stored to the sense amplifier, and transmitting the sense operation halt control signal externally; and a decoder for receiving the address signal of the target memory cell and generates access control signals for controlling operations of the plurality of first memory cells, the plurality of transfer gates, the sense amplifier, the equalizer, and the plurality of second memory cells, and transmits the address control signals to the plurality of word lines, the plurality of transfer gates, the plurality of second memory cells, and the sense amplifier, wherein when a memory cell in the plurality of first memory cells in another memory cell group connected is a target memory cell to be accessed in series, a sense operation for the first memory cells including the target memory cell in another memory cell group is executed after the data items temporarily have been saved into the plurality of second memory cells are restored into corresponding the plurality of first memory cells including the preceding target memory cell.

In the synchronous memory system with a cascade-type memory cell structure just described, the number of the plurality of first memory cells in each memory cell group is four first memory cells.

In the synchronous memory system with a cascade-type memory cell structure described above, the number of the plurality of first memory cells in each memory cell group is sixteen first memory cells.

In the synchronous memory system with a cascade-type memory cells described above, the selector generates a control signal to select each of the plurality of first memory cells including the target memory cell based on the address designating the target memory cell, transmitting the control signal to the decoder, and generating a stop signal in order to halt the sense operation for the plurality of first memory cells when the transmission of data stored in the target memory cell to the sense amplifier is completed, and transmits the stop signal to the decoder and external devices.

In the synchronous memory system with a cascade-type memory cells described above, the equalizer comprises first and second transistors connected in series provided to each of the plurality of bit lines, and a third transistor connected to each of the plurality of bit lines, and gates of the first, the second, and the third transistors are connected to each other and an intermediate point between the first transistor and the second transistor is connected to a power source.

In the synchronous memory system with a cascade-type memory cells described above, the sense amplifier comprises a first type MOS transistor pair connected in series and a second type MOS transistor pair connected in series, the first type MOS transistor pair and the second type MOS transistor pair are connected to the bit selection line pair in parallel, both gates of the first type MOS transistor pair are connected to the bit selection line and both gates of the second type MOS transistor pair are connected to the bit selection line.

In the synchronous memory system with a cascade-type memory cells described above, the plurality of first memory cells are arranged in rows and columns, and the selector comprises:

a first counter for counting a row position in the rows, generating a row position signal according to the row position;

a second counter for counting a column position in the columns, generating a column position signal according to the column position; and a comparator for comparing the row position signal and the column position signal with a target position signal according to the address of the target memory cell, and generates the sense operation halt control signal externally if the row position signal and the column position signal are agree with the target position signal.

In the synchronous memory system with a cascade-type memory cells described above, each transfer gate in the plurality of transfer gates comprises a MOS transistor pair whose gates are connected to the selector.

As another preferred embodiment of the present invention, a multi-bank synchronous memory system with a multi-bank structure comprising:

a plurality of synchronous memory systems with a cascade-type memory cell structure in which receiving of an address for a memory cell to be accessed and readout of data stored from the memory cell being performed in synchronization with a first clock signal supplied externally, and the plurality of synchronous memory cell systems being divided into a plurality of banks in a multi-bank structure, data in the memory cell in each bank being sensed independently, and each of the plurality of synchronous memory systems comprising:

a plurality of word lines;

a plurality of bit lines;

a plurality of first memory cells having a cascade-type configuration connected to the plurality of word selection lines, the plurality of first memory cells forming a memory cell group in a plurality of memory cell groups in a memory cell array, the memory cell group being connected to one of the plurality of bit lines;

a plurality of transfer gates provided to each of the plurality of the bit lines to connect each memory cell group to each of the plurality of the bit lines;

a sense amplifier connected to each of the plurality of bit lines for storing data to be written into each of the plurality of first memory cells or for storing data to be read out from each of the plurality of first memory cells;

an equalizer provided for the sense amplifier for equalizing a voltage potential of each of the plurality of bit lines;

a plurality of second memory cells located between the plurality of first memory cells and the sense amplifier, the plurality of second memory cells provided for the plurality of first memory cells;

a selector for receiving an address of a target memory cell to be accessed in the plurality of first memory cells according to the first clock signal, selecting each of the plurality of first memory cells while saving data of the selected each of the plurality of first memory cells to the plurality of second memory cells in synchronism with the first clock signal and counting a number of the selected each of the plurality of first memory cells, generating a sense operation halt control signal when the target memory cell being selected and whose data being stored to the sense amplifier, and transmitting the sense operation halt control signal externally; and a decoder for receiving the address of the target memory cell and generates access control signals for controlling operations of the plurality of first memory cells, the plurality of transfer gates, the sense amplifier, the equalizer, and the plurality of second memory cells, and transmits the address control signals to the plurality of word lines, the plurality of transfer gates, the plurality of second memory cells, and the sense amplifier, wherein when a memory cell in the plurality of first memory cells in another memory cell group connected is a target memory cell to be accessed in series, a sense operation for the first memory cells including the target memory cell in another memory cell group is executed after the data items temporarily have been saved into the plurality of second memory cells are restored into corresponding the plurality of first memory cells including the preceding target memory cell.

In the multi-bank synchronous memory system just described the memory cell in the cascade-type structure in one bank are selected for data access operation and this data is stored in the sense amplifier during an output operation for data of a memory cell in another bank, and when a request for a data transfer of the memory cell in this another bank is happened, the data in the memory cell in the one bank is not stored into the sense amplifier, or not have been completed, a signal indicating that the data access operation is not possible is transmitted externally.

In the multi-bank synchronous memory system described above, the plurality of memory cell groups in each bank are further divided into at least two memory cell groups in which data of the plurality of memory cells in a cascade-type structure in each bank group can be sensed and stored into each of the sense amplifier respectively and independently, data transfer operation for one bank group is continuously performed after this one bank group has been activated, and other bank group is activated while this one bank group is accessed for the data transfer, and the data transfer operation of the one bank group and the data transfer operation of the other bank group are executed in a combined cycle, and the data transfer operations of the plurality of bank groups are divided into a group of congestion cycles to be executed correctly.

As another preferred embodiment of the present invention, a multi-bank synchronous memory system with a cascade-type memory cell structure comprising a plurality of memory chips, each memory chip comprising a synchronous memory system described above, the plurality of memory chips being arranged in matrix, and the plurality of memory chips being divided into at least two bank groups, wherein data transfer operation for one bank group is continuously performed after this one bank group has been activated and other bank group is activated while this one bank group is accessed for the data transfer, and the data transfer operation for the one bank group and the data transfer operation for the other bank group are executed in a combined cycle, and the data transfer operations of the plurality of bank groups are divided into a group of congestion cycles to be executed correctly.

BRIEF DESCRIPTION OF THE DRAWINGS

These and other objects, features, and advantages of the present invention will become more apparent from the following description of the preferred embodiments taken in conjunction with the accompanying drawings, in which:

FIG. 2A is a configuration drawing of a first embodiment of a synchronous memory system with a cascade-type memory cell structure of the present invention.

FIG. 11 is a view for explaining the basic operation of the selector shown in FIG. 10A.

DETAILED DESCRIPTION OF THE PREFERRED EMBODIMENTS

Figure 1:
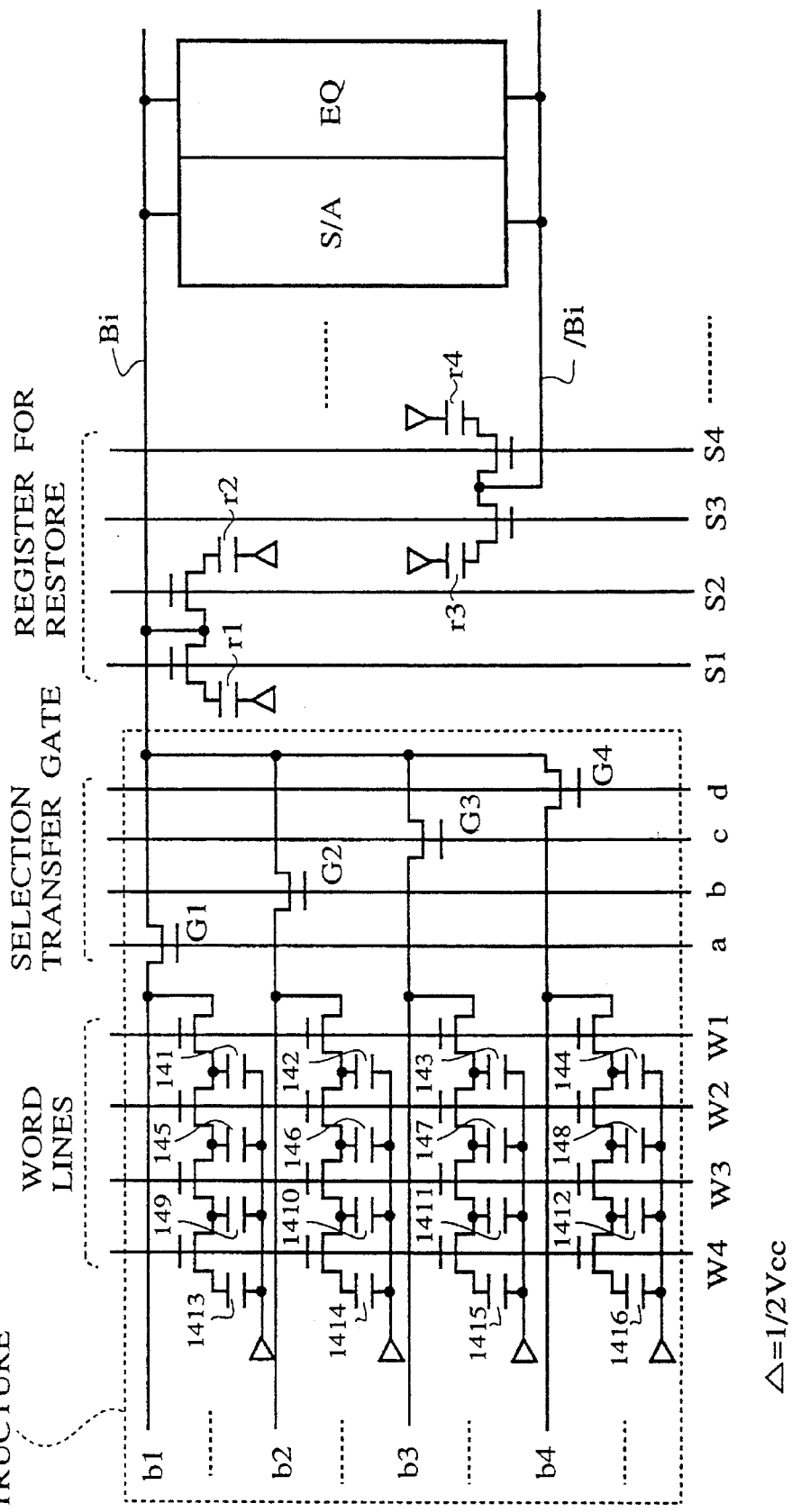
FIG. 1 is a configuration drawing of a conventional synchronous memory system with a cascade-type memory cell structure.

Other features of this invention will become apparent in the course of the following description of exemplary embodiments which are given for illustration of the invention and are not intended to be limiting thereof. Embodiments of the present invention will now be explained with reference to the drawings.

FIG. 2A is a configuration drawing of a first embodiment of a synchronous memory system 100 with a cascade-type memory cell structure of the present invention.

A memory cells of the cascade-gate-type cell (CGC) structure has a plurality of transistors and a plurality of capacitors. Each capacitor is located between each pair of the transistors for storing data. Each transistor (a gate) is connected to each word line. A predetermined number of capacitors are connected in series and one end of the capacitors is connected to a bit line. The predetermined number of the capacitors are divided into a memory cell group. The memory cell group is called as the memory cell having the cascade-gate-type cell structure.

In the memory system 100 or bank of this embodiment, a plurality of cascadingly-linked memory cells are divided into groups of memory cells belonging each row. For example, a row decoder 18 selects the row 2 by receiving a control signal C (Row indicating signal) provided externally. Four memory cells (1, 2, 3, 4) belong to the row 2. Each of the memory cells (1, 2, 3, 4) belonging to this row 2 is selected by a control signal (or a count result signal) b(b0, b1, ...) generated by control signals A, B entered into a selector 20.

There are four main external control signals entered into the memory system 100. These are a control signal C (C0, ...) for indicating a row, a control signal A (A0, ...) for indicating a track in a row; a control signal B (B0, ...) for indicating a stack in a row; and a count-up signal, a system clock signal SCint and a Set signal.

These control signals are used for designating a read operation from a memory cell, and for specifying a memory cell which is the object of a restore operation.

A counter 22 receives the system clock signal SCint supplied externally, and when a Set signal is entered synchronously with the system clock signal SCint, an initial value (for example, "0") is set. The continuously entered system clock signals SCint are then counted and a transmission clock signal CK based on the number counted (specifically, obtained by dividing the system clock signal SCint) is supplied to the selector 20 and a sense controller 23.

An object memory cell is selected from among the memory cells belonging to the row 2. Specifically, addressing is performed by the externally input control signals A, B, C.

The memory system 100 has an equalizer EQ and a sense amplifier S/A (SA1, AS2, ...) for bit line precharge operation and data sensing operation.

Figure 2B:
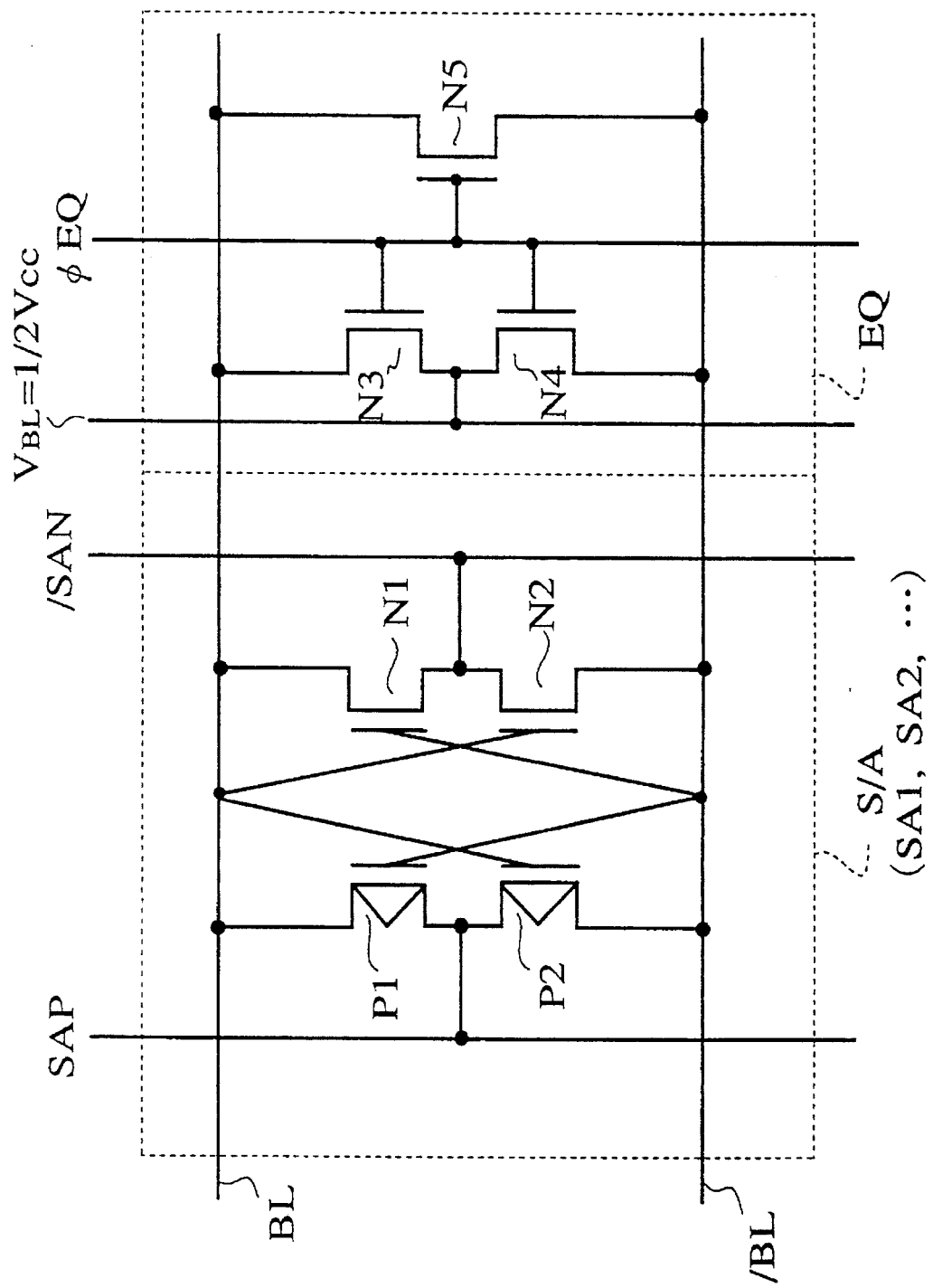
FIG. 2B is a configuration diagram of a sense amplifier and an equalizer used in the synchronous memory system shown in FIG. 2A.

FIG. 2B is a configuration diagram of a sense amplifier S/A (SA1, SA2, ...) and an equalizer EQ connected to a bit line Bi incorporated in the synchronous memory system shown in FIG. 2A.

The equalizer includes a N type MOS transistor N5 connected between the two bit lines BL and /BL, and two N type MOS transistors N3 and N4 connected between the two bit lines BL and /BL in series. Gates of the NMOS transistors N3 to N5 are connected to a $\phi$EQ line. An intermediate point between the two NMOS transistors N3 and N4 are connected to a power source $V_{BL}$ line which has a half Vcc voltage potential. When the $\phi$EQ line changes from a low level to a high level, the NMOS transistors are ON, Thereby, the two bit lines BL and /BL are precharged to a half Vcc voltage potential. Thus, the equalizer EQ precharges the bit lines BL and /BL to the half Vcc voltage potential.

The sense amplifier S/A includes two P channel MOS transistors P1 and P2 (PMOS pair) connected between bit lines BL and /BL in series and two N type MOS transistors (NMOS pair) connected between the bit lines BL and /BL in series. Both sides of the PMOS pair are connected to the bit lines BL and /BL. Both sides of the NMOS pair are also connected to the bit lines BL and /BL. An intermediate point between the PMOS pair P1 and P2 is connected to a control signal SAP line. An intermediate point between the NMOS pair N1 and N2 is connected to a control signal /SAN line. Both gates of the PMOS transistor P1 and the NMOS transistor N1 are connected to the bit line /BL. Both gates of the PMOS transistor P2 and the NMOS transistor N2 are connected to the bit line BL.

The following are description of read operation (or sensing operation).

Prior to the read operation, $\phi$EQ is at "H" (high level, 5 volts), which causes transistors N3, N4 and N5 to turn on and bit line pair BL and /BL to be equalized with a half-Vcc (½ Vcc, 2.5 volts). In synchronism with the signal CK, $\phi$EQ turns from "H" to "L" (low level, 0 volts), which terminates the equalization of bit line pair BL and /BL. The potential of the word line W1 turns from "L" to "H" (boosted high level, Vpp, 8 volts), which causes the memory cell 1 of the cascade gate cell CGC to provide the storage data to bit line BL. The data, as a representation of a little voltage fluctuation of the bit line, is transferred to sense amplifier S/A through transfer gate G1. Then, the potential of SAP turns from ½ Vcc to "H" and the potential of /SAN turns from ½ Vcc to "L", which causes a sensing operation of the sense amplifier. Then, the data of a little voltage fluctuation is completely amplified into "H" or "L". Then the potential of S! turns from "H" to "L", which causes the temporally storage cell r1 to store the amplified data within.

After the sensing operation of data stored at cell 1, sensing operations for cells 2, 3, and 4 follows. Two word lines W1 and W2 turn to "HH" when the cell 2 is sensed; three word lines W1, W2, and W3 turn to "H" when the cell 3 is sensed, and four word lines W1, W2, W3, and W4 turn to "HH" when the cell 4 is sensed. Those four steps of sensing are done in synchronism with clock signal CK.

Figure 2C:
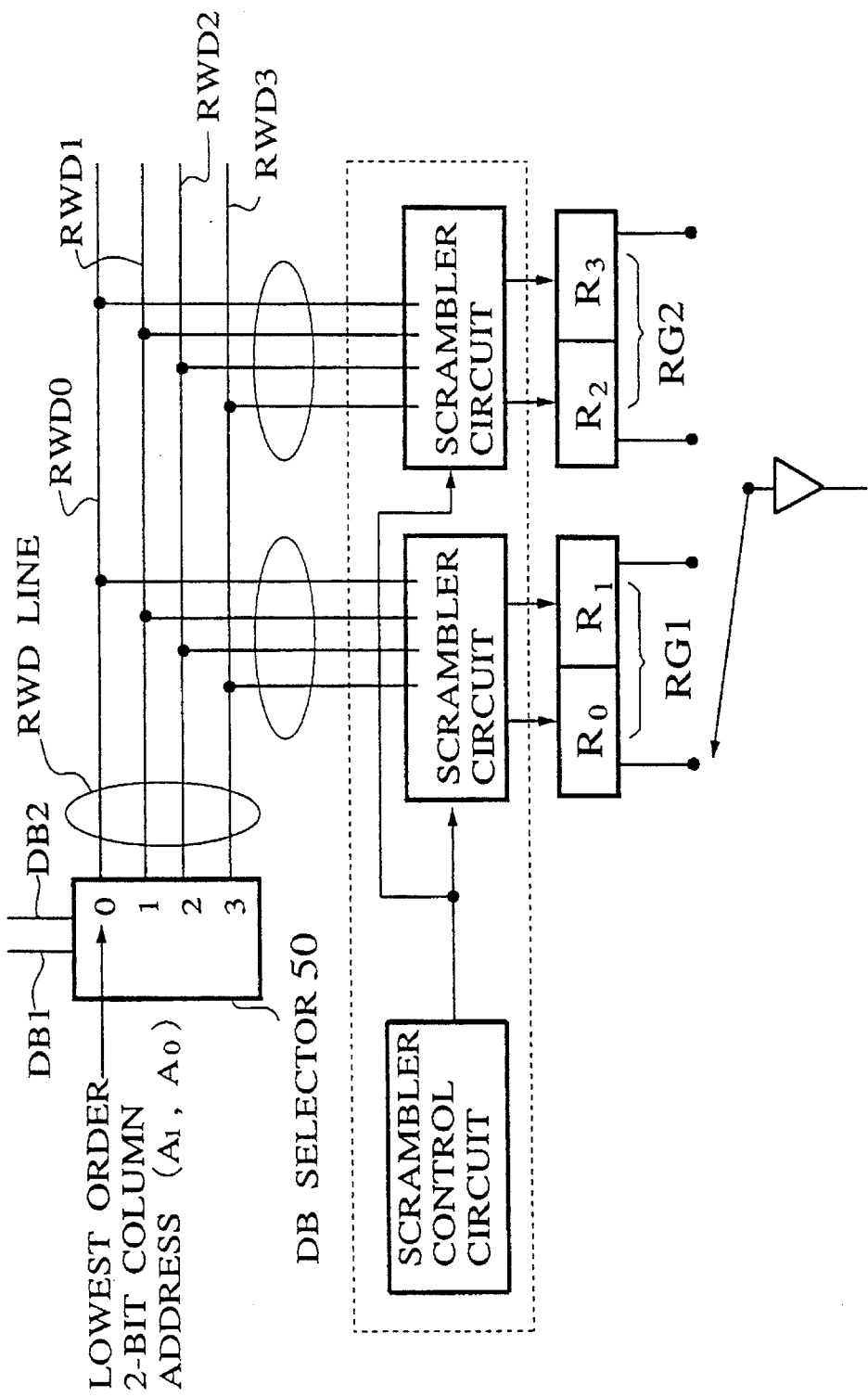
FIG. 2C is a configuration of a DB selector incorporated in the synchronous memory system shown in FIG. 2A.

FIG. 2C is a configuration of a DB selector 50 incorporated in the synchronous memory system 100 shown in FIG. 2A.

Data sensed by the sense amplifier S/A is transmitted to data bus lines DB1, DB2 through transfer gates Tr20, Tr21, Tr22, . . . whose operations are controlled by column selection signal (CSL1, CS12, CSL3, . . . ) lines. Then, the data on the data bus DB1, DB2 is selected by the DB selector 50 and transmitted to read write data lines RWD1, RWD2. As shown in FIG. 2C, the DB selector 50 received a lowest order 2 bits (A1, A0) of column address and selects one of the read write data lines RWD1 and RWD2. The data selected by the DB selector 50 is transmitted to external devices through a scrambler circuit.

Figure 2D:
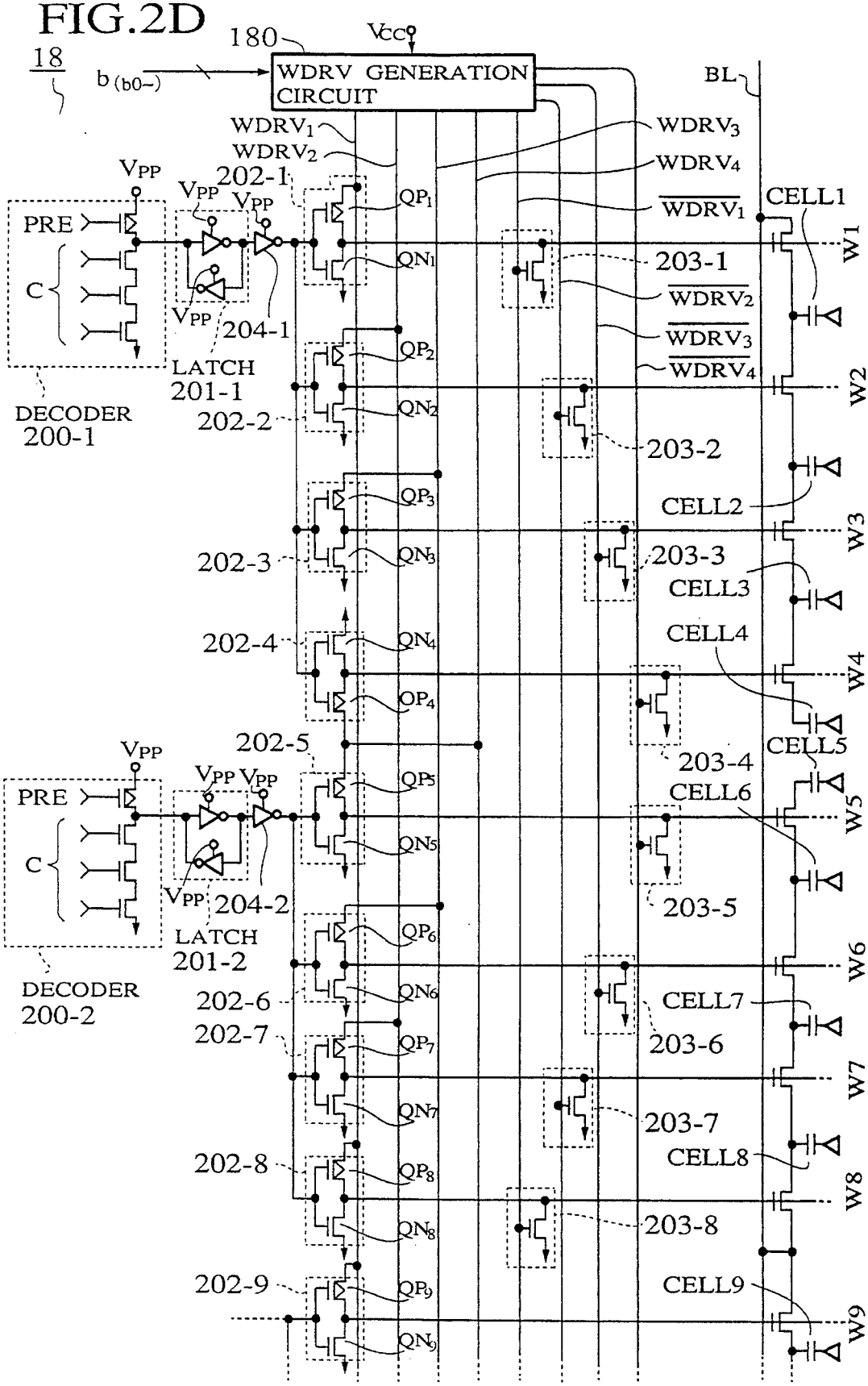
FIG. 2D is a configuration of a row decoder incorporated in the synchronous memory system shown in FIG. 2A.

FIG. 2D is a configuration of the row decoder 18 incorporated in the memory system 100.

The row decoder 18 receives the control signal C (C0, . . . ) for indicating a row in the row1, row2, . . . , a control signal A (A0, . . . ) for indicating a track in a row; a control signal (or a count result signal) b (b0, b1, . . . ) for indicating one of four memory cells 1, 2, 3, 4, and a reset signal PRE for setting the row decoder 18 into an initial state.

As shown in FIG. 2D, the row decoder 18 includes a plurality of decoders 200, a plurality of latch circuits 201, a plurality of word line driver units 202 (202-1, 202-2, 202-3, 202-4), a plurality of noise killer transistors 203 (203-1, 203-2, 203-3, 203-4), and a word line drive (WDRV) generation circuit 180.

Each decoder 200 receives the control signal C (C0, c1, . . ) for indicating a row in order to decode the row address. Each latch circuit 201 receives and stores a result of the latch operation transmitted from the decoder 200.

Each of the plurality f word line driver units 202-1, 202-2, 202-3, 202-4 comprises a P channel MOS transistor (PMOS transistor) and a N channel MOS transistor (NMOS transistor) connected in series. An intermediate point between the PMOS transistor and NMOS transistor is connected to each word line (W1, W2, W3, . . . ) on which a plurality of memory cells 1, 2, 3, 4, . . . are provided. Both gates of the PMOS transistor and NMOS transistor are connected to the latch circuit 201 through an inverter 204.

One feature of the row decoder 18 of the present invention, each word line driver unit 202 includes the PMOS transistor, so that it is possible to keep each of the word lines W1, W2, W2, W4 at a high voltage potential while a long time period. The word line drive generation circuit 180 supplies a high voltage $V_{PP}$ (8 volts) to each of the word line drive unit 202 because the word line drive unit 202 comprises the PMOS transistor.

Other feature of the row decoder 18 of the present invention has the latch circuit 201 provided between the decoder 200 and the word line drive unit 202. Thereby, it is not required to perform the decode operation again and again when a new selection operation for the word line w1 to W4 is required after the preceding selection operation to select each of the word lines W1 to W4 is completed.

Other feature of the row decoder 18 of the present invention has the noise killer transistor 203 (203-1, 203-2, . . ) provided between each of the word line drive units 202 (202-1, 202-2, . . . ) and each of the memory cells (1, 2, 3, 4) on each of the word lines W1 to W4. When both gates of the PMOS and NMOS transistors in the word line drive unit 202 is a low level "L" and the intermediate point between the PMOS and NMOS transistor is also the low level "L", the word line is in a floating state. In order to avoid this floating state, it is required the nose killer transistor 203 for each word line. The noise killer transistor 203 can be performed by the source power $V_{cc}$ (5 volts), so that a $V_{PP}$ generator (a bootstrap circuit or a booster) incorporated in the WDRV generation circuit 180 is made by a smaller size in power supply.

The WRDV generation circuit 180 including the VPP generator 186 will now be described below.

The WRDV generation circuit 180 provides the Voltage $V_{PP}$ (8 volts) to the word line drive units 202(202-1, . . . 202-4) through the lines WDRV1 to WDRV4. In addition, the WDRV generation circuit 180 also provides the voltage $V_{DD}$ (5 volts) to the noise killer transistors 203 (203-1, 203-2) through the lines /WDRV1 to /WDRV4.

Figure 2E:
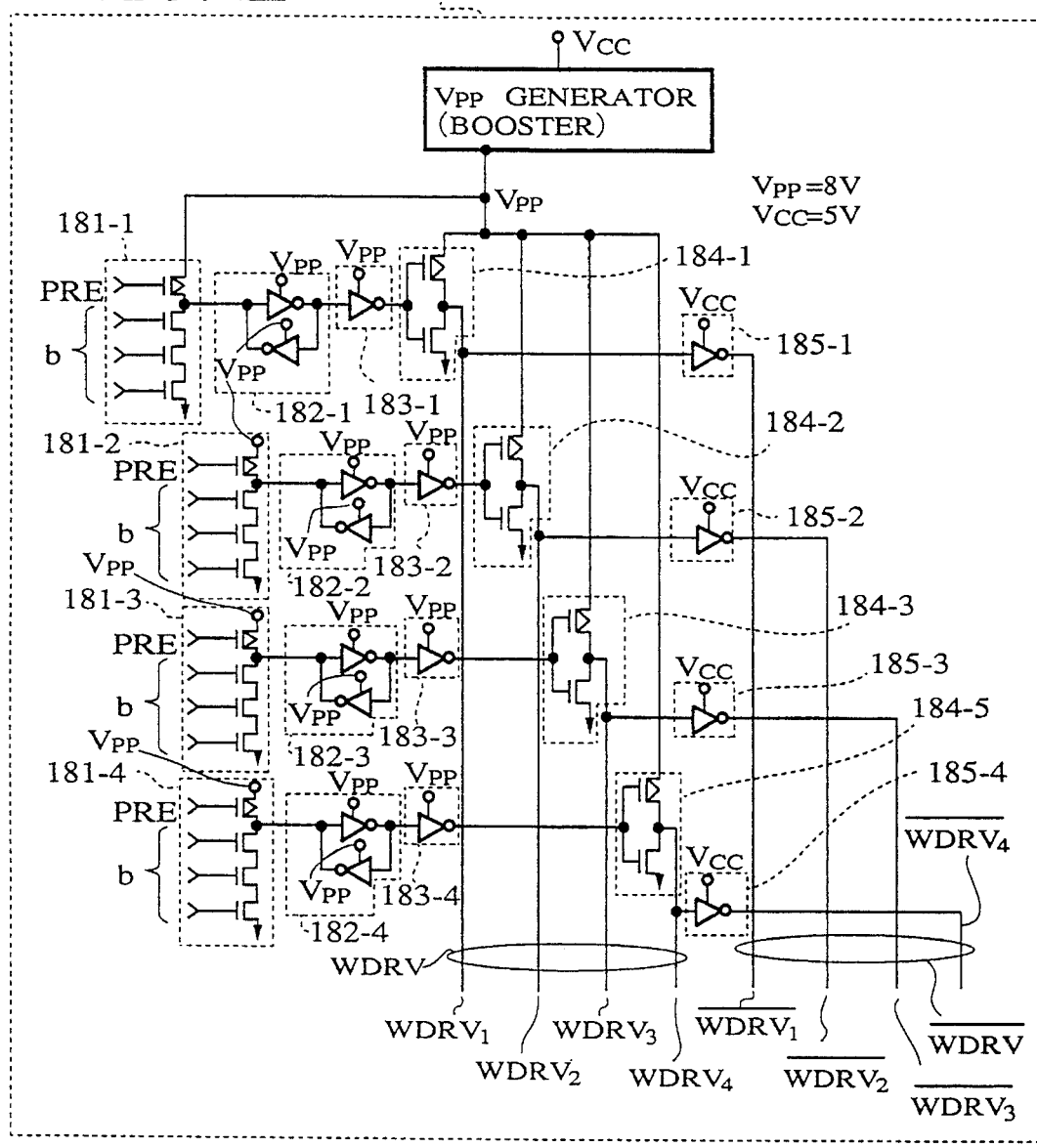
FIG. 2E is a configuration of a word line driver (WDRV) generation circuit incorporated in the row decoder shown in FIG. 2D.

FIG. 2E is a configuration of the WDRV generation circuit 180 incorporated in the row decoder 18 shown in FIG. 2D. The WDRV generation circuit 180 comprises a plurality of decoders 182 (102-1, 182-2, . . . ), a plurality of latch circuits 182 (182-1, 182-2, . . . ), a plurality of drive circuits 184 (184-1, 184-2, . . . ), a plurality of inverters 185 (185-1, 185-2, . . . ), and the $V_{PP}$ generator 186. Each decoder 182 receives the control signal (or a count result signal) b(b0, b1, . . . ) for indicating each memory cell (belonged to each stack) transmitted from the selector 20, and decodes the control signal (or a count result signal) b(b0, b1, . . . ). The latch circuit 182 receives the decoded control signal b(b0, b1, . . . .) and latches the decoded control signal (or a count result signal) b(b0, b1, . . . ). Each drive circuit 184 (184-1, 184-2, . . . ) received the latched control signal (or a count result signal b) b (b0, b1, . . . ) through the inverter 183 which is operated by the power supply $V_{PP}$ (8 volts) supplied from the $V_{PP}$ generator 186. Then, each drive circuit 184 (184-1, 184-2, . . . ) selects one of the lines WDRV1 to WDRV4. Each inverter 185 (185-1, 185-2, 185-3, . . . ) is operated by the power supply $V_{CC}$ (5 volts) and supplies the power $V_{CC}$ through the line /WDRV1 to /WDRV4. The configuration of each drive circuit 184 is the same as that of the word line drive unit 202 shown in FIG. 2D.

Figure 2F:
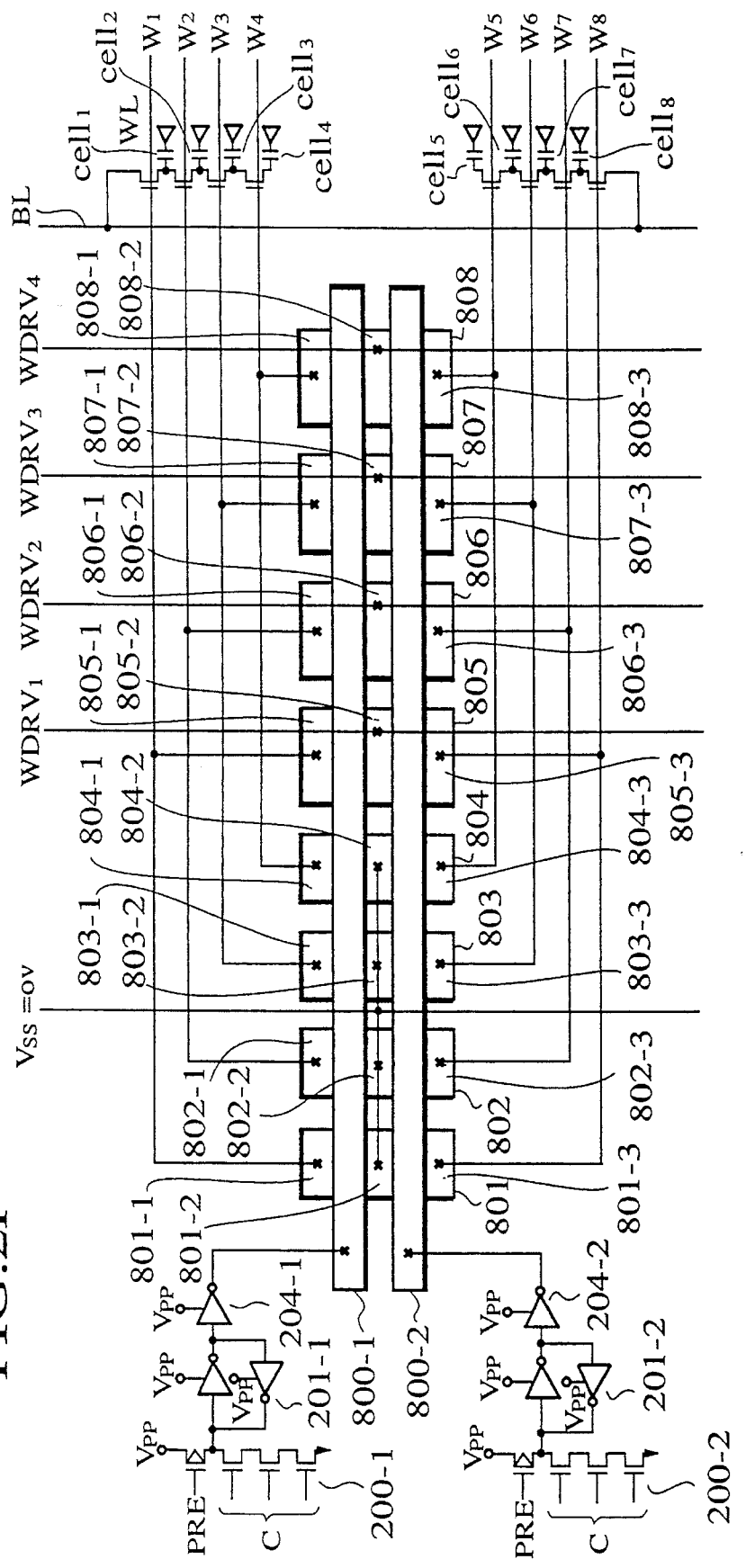
FIG. 2F is a plan view of the word line driver units in the row decoder shown in FIG. 2D.

FIG. 2F shows a plan view of the word line driver units 202-1, to 202-8 in the row decoder 18. A $S_1O_2$ film 809 covers a surface of a silicon chip. A plurality of transistor regions 801 to 808 are arranged along a word line direction. regions 801, 802, 803 and 804 are located in a P conductivity type well, which are for N channel transistors QN1, QN2, QN3, QN4, QN5, QN6, QN7, and QN8. Regions 805, 806, 807, and 808 are located in a N conductivity type well, which are for P channel transistors (QP1, QP2, QP3, QP4, QP5, QP6, QP7 and QP8. Polysilicon bars 800-1 and 800-2 are arranged, in parallel, along the word line direction, and drive the transistor regions. The Polysilicon bar 800-1 is a common gate of the transistors QN1, QN2, QN3, QN4, QP1, QP2, QP3, and QP4 which is connected to the inverter 204-1. The Polysilicon bar 800-2 is a common gate of the transistors QN5, QN6, QN7, QN8, QP5, QP6, QP7 and QP8 which is connected to the inverter 204-2. Thin insulating films are interposed between the common gates and the transistor regions. regions 801-1, 801-2, 801-3, 802-1, 802-2, 802-3, . . . 804-2 and 804-3 are implanted with N conductivity ions such as As, and are N conductivity type. regions 805-1, 805-2, 805-3, 806-1, 806-2, 806-3, . . . 808-2 and 808-3 are implanted with P conductivity ions such as Boron, and are P conductivity type.

Region 801-1, common gate 800-1 and region 801-2 provide the N channel transistor QN1; N conductivity type region 801-1 is the drain, N conductivity type region 801-2 is the source, common gate 800-1 is the gate, and a region behind the common gate is the channel.

Region 801-3, common gate 800-2 and region 801-2 provide the N channel transistor QN8; N conductivity type region 801-3 is the drain, N conductivity type region 801-2 is the source, common gate 800-2 is the gate, and a region behind the common gate is the channel.

Region 802-1, common gate 800-1 and region 802-2 provide the N channel transistor QN2; N conductivity type region 802-1 is the drain, N conductivity type region 802-2 is the source, common gate 800-1 is the gate, and a region behind the common gate is the channel.

Region 802-3, common gate 800-2 and region 802-2 provide the N channel transistor QN7; N conductivity type region 802-3 is the drain, N conductivity type region 802-2 is the source, common gate 800-2 is the gate, and a region behind the common gate is the channel.

Region 803-1, common date 800-1 and region 803-2 provide the N channel transistor QN3; N conductivity type region 803-1 is the drain, N conductivity type region 803-2 is the source, common gate 800-1 is the gate, and a region behind the common gate is the channel.

Region 803-3, common gate 800-2 and region 803-2 provide the N channel transistor QN6; N conductivity type region 803-3 is the drain, N conductivity type region 803-2 is the source, common gate 800-2 is the gate, and a region behind the common gate is the channel.

Region 804-1, common gate 800-1 and region 804-2 provide the N channel transistor QN4; N conductivity type region 804-1 is the drain, N conductivity type region 804-2 is the source, common gate 800-1 is the gate, and a region behind the common gate is the channel.

Region 804-3, common fate 800-2 and region 804-2 provide the N channel transistor QN5; N conductivity type region 804-3 is the drain, N conductivity type region 804-2 is the source, common gate 800-2 is the gate, and a region behind the common gate is the channel.

Region 805-1, common gate 800-1 and region 805-2 provide the P channel transistor QP1; P conductivity type region 805-1 is the drain, P conductivity type region 805-2 is the source, common gate 800-1 is the gate, and a region behind the common gate is the channel.

Region 805-3, common gate 800-2 and region 805-2 provide the P channel transistor QP8; P conductivity type region 805-3 is the drain, P conductivity type region 805-2 is the source, common gate 800-2 is the gate, and a region behind the common gate is the channel.

Region 806-1, common gate 800-1 and region 806-2 provide the P channel transistor QP2; P conductivity type region 806-1 is the drain, P conductivity type region 806-2 is the source, common gate 800-1 is the gate, and a region behind the common gate is the channel.

Region 806-3, common gate 800-2 and region 806-2 provide the P channel transistor QP7; P conductivity type region 806-3 is the drain, P conductivity type region 806-2 is the source, common gate 800-2 is the gate, and a region behind the common gate is the channel.

Region 807-1, common gate 800-1 and region 807-2 provide the P channel transistor QP3; P conductivity type region 807-1 is the drain, P conductivity type region 807-2 is the source, common gate 800-1 is the gate, and a region behind the common gate is the channel.

Region 807-3, common gate 800-2 and region 807-2 provide the P channel transistor QP6; P conductivity type region 807-3 is the drain, P conductivity type region 807-2 is the source, common gate 800-2 is the gate, and a region behind the common gate is the channel.

Region 808-1, common gate 800-1 and region 808-2 provide the P channel transistor QP4; P conductivity type region 808-1 is the drain, P conductivity type region 808-2 is the source, common gate 800-1 is the gate, and a region behind the common gate is the channel.

Region 808-3, common date 800-2 and region 808-2 provide the P channel transistor QP5; P conductivity type region 808-3 is the drain, P conductivity type region 808-2 is the source, common gate 800-2 is the gate, and a region behind the common gate is the channel.

The sources of N channel transistors QN1 and QN8 are shared; the sources of N channel transistors QN2 and QN7 are shared; the sources of N channel transistors QN3 and QN6 are shared; and the sources of N channel transistors QN4 and QN5 are shared. Those sources are commonly connected to a wiring supplied with ground potential Vss (=0 V). The source of P channel transistors QP1 and QP8 are shared and commonly connected to a WDRV1 line; the sources of P channel transistors QP2 and QP7 are shared and commonly connected to a WDRV2 line; the source of P channel transistors QP3 and QP6 are shared and commonly connected to a WDRV3 line; and the source of P channel transistors QP4 and QP5 are shared and commonly connected to a WDRV4 line. Accordingly, the area occupied with word line driver units 202-1 to 202-8 is reduced, which is very suitable for the word line driver units for CGC cells. With the structure of FIG. 2F, the word line pitch is greatly reduced.

A synchronous read-out method for the memory system 100 of the first embodiment will now be explained.

Figure 3:
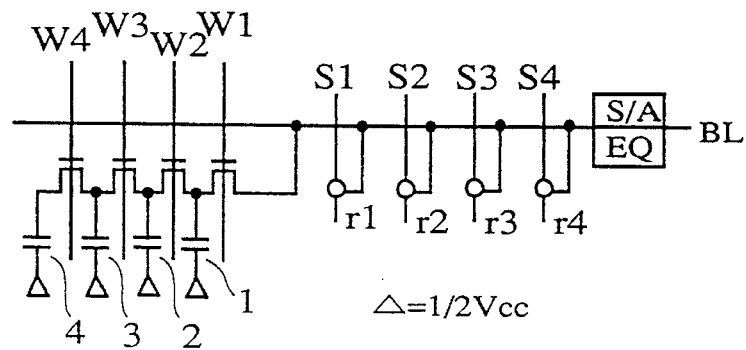
FIG. 3 is a conceptual view showing the hierarchy of one row in the memory system shown in FIG. 2A.

In this embodiment of the memory system or a bank 100 shown in FIG. 2A, four cascade-linked memory cells 1 to 4 are formed into one memory cell unit or one memory cell group as shown in FIG. 3.

For this reason, the number of contacts (number of bit-line contacts) in the four cascade-linked memory cells is reduced to about one-quarter of that of memory cells without a cascade-linked structure. As a result, when the number of transistors formed on the chip is the same, the memory system with the cascade-type cell structure has the smaller chip area.

In FIG. 3, when the data in the memory cell which has the shallowest position in among the four cascade-linked memory cells 1 to 4 is read out, the word line W1 is set at the high level and the read-out takes place on a bit line BL.

When the data is read out of the memory cell 2, the read-out takes place on the bit line BL by setting both the word line W1 and the word line W2 at the high level. However, in this case the data in the memory cell 1 is destroyed by reading out the data in the memory cell 2, therefore, prior to reading the data out of the memory cell 2, the content of the memory cell 1 must be saved.

When the data is read out of the memory cell 3, the read-out takes place on the bit line BL by setting the word line W1, the word line W2, and the word line W3 at the high level. In this case the data items in the memory cells 1 and 2 are destroyed by reading out the data in the memory cell 3. Therefore the contents of the memory cells 1 and 2 must be saved prior to reading the data out of these memory cells.

In the same manner, when the data is read out of the memory cell 4, the read-out occurs on the bit line BL by setting the word line W1, the word line W2, the word line W3, and the word line W4 at the high level. In this case the data items in the memory cells 1, 2, and 3 are destroyed by reading out the data in the memory cell 4, therefore the contents of these cells must first be saved. These operations are executed under control of the selector 20 in synchronism with the clock signal CK obtained by dividing the system clock signal SCint.

The detailed operation of the selector 20 will be later explained.

In the first embodiment of the memory cell or bank 100, the output of the collected data is performed in a set sequence, synchronous with the clock signal CK obtained by dividing the system clock signal SCint used to enter the address signal, and data output is provided in a high speed cycle.

The above-mentioned registers for saving (hereinafter called as "a save register") used in the synchronous read-out method for the cascade-linked memory cells of the present embodiment is shown in detail in FIGS. 4A to 4G.

Figure 4A:
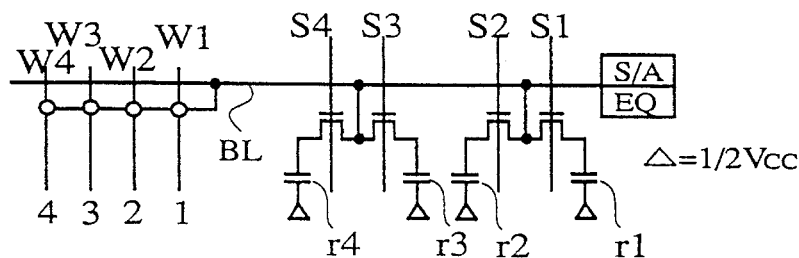
FIGS. 4A to 4G illustrate various configuration drawings of save registers in the memory system shown in FIG. 2A.

FIG. 4A shows a case where the save registers r1 to r4 are formed from four DRAM cells (DRAMs) r1 to r4. Each of the DRAM cells (r1, r2, r3, r4) is a capacitor which is connected to a bit line BL through a gate which is formed by a MOS transistor. An intermediate point of two capacitors (a capacitor pair) are connected to the bit line BL. As shown in FIG. 4A, data stored in the memory cell 1 is transmitted and stored into the save register r1 at first. At second, data stored in the memory cell 2 is transferred and stored to the save register r2. Then, like the first and second transmission just described above, data items stored in the memory cells 3 and 4 are transmitted and stored into the save registers r3 and r4, sequentially. In a restore operation to the memory cells 1 to 4, the data stored in the save registers r4, r3, r2, and r1 are transmitted and stored in order to the memory cells 4, 3, 2, and 1, sequentially.

Figure 4B:
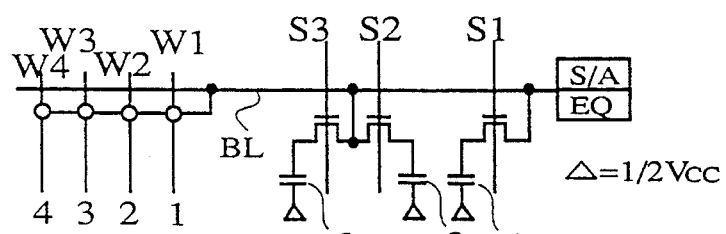

FIG. 4B shows a case where three save registers r1 to r3 are formed from three DRAM cells. In this case each save register is formed the DRAM cell described in FIG. 2A and the data stored in an target memory cell to be accessed is read out only to a sense amplifier (S/A) and not stored into the save registers r1 to r3. In this case, when a target memory cell to be accessed is the memory cell 4, data stored in the memory cells 1 to 3 are transmitted and stored in order into the save registers r1 to r3 sequentially, when the data in the target memory cell 4 is sensed by the sense amplifier S/A, the data items stored in the save register r1 to r3 are transmitted and restored in order into the memory cells 1 to 3.

Figure 4C:
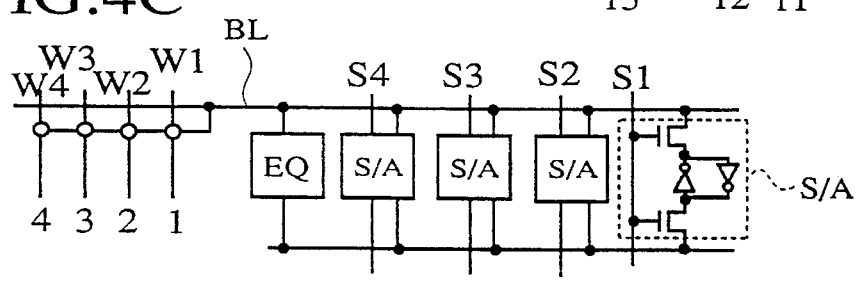

FIG. 4C shows a case where the save register is formed from four circuits. Each circuit comprises two MOS transistors connected in series and an flip/flop (F/F). The two MOS transistors are incorporated into each of the save registers r1 to r4 because each save register is used as a temporarily cell for storing data from each memory cell. At an intermediate point between the two MOS transistors, a flip/flop (F/F) is connected. The two transistors are connected to a bit line BL. In this case, the order of the save operation to the save registers and the restore operation to the memory cells 1 to 4 are performed like the case shown in FIG. 4A.

Figure 4D:
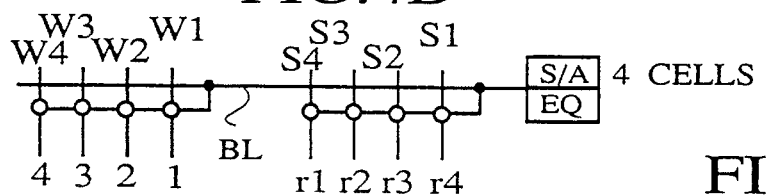

FIG. 4D shows a case where the save registers r1 to r4 are formed from a NAND memory cells having the cascade-type configuration made up of four memory cells, equivalent in number to the four cascade-linked memory cells. In this case, at first data stored in the memory cell 1 is transmitted and stored into the save register r1. At second, data stored in the memory cell 2 is transmitted and stored into the save register r2, then data items stored in the memory cells 3 and 4 are transmitted and stored to the save memory cells r3 and r4, in order. In the restore operation from the save registers r1 to r4 to the memory cells 1 to 4, at first, the data stored in the save register r4 is transmitted to the memory cell 4, then the data items stored in the save memory r3, r3, r1 are transmitted to the memory cells r3 to r1 in order.

Figure 4E:
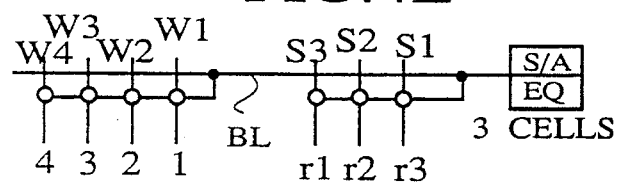

FIG. 4E shows a case where the save registers r1 to r3 are formed from a NAND unit which is made up of three memory cells r1 to r3. The data stored in a target memory cell to be accessed is read out only to a sense amplifier (S/A) and is not stored in the save registers r1 to r3 like the case shown in FIG. 4B. In this case, when a target memory cell to be accessed is the memory cell 4, data stored in the memory cells 1 to 3 are transmitted and stored in order into the save register r1 to r3 sequentially, when the data in the target memory cell 4 is sensed by the sense amplifier S/A, the data items stored in the save register r3, r2, r1 are transmitted in order and restored in order into the memory cells 3, 2, and 1.

Figure 4F:
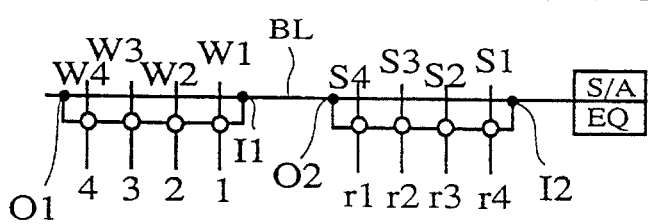

FIG. 4F shows a case where the save registers r1 to r4 are formed from a NAND unit made up of four memory cells like the case shown in FIG. 4D. In this case, the both sides of the NAND unit are connected to the bit line BL. In addition, both sides of the memory cells 1 to 4 are also connected to the bit line BL. In this case, during the save operation to the save registers r1 to r4, data items stored in the memory cells 1 to 4 are transmitted into the save registers r1 to r4 through a node O1 and a node I2 cyclicly. During the restore operation to the memory cells 1 to 4, data items stored in the save registers r1 to r4 are transmitted into the save registers r1 to r4 through a node O2 and a node I1 cyclicly.

Figure 4G:
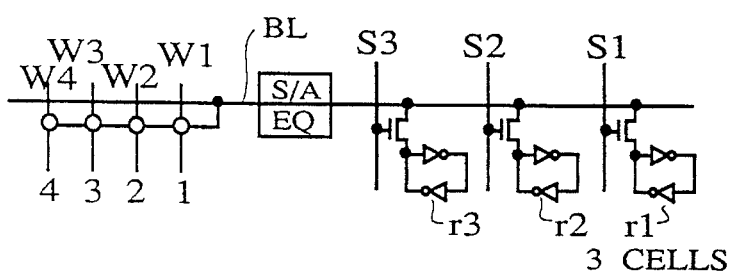

FIG. 4G shows a case where each of the save register r1 to r3 are formed from a flip/flop and a MOS transistor. A source of the MOS transistor is connected to a bit line BL. A drain of the MOS transistor is connected to the flip flop (F/F). The save operation to the save registers and the restore operation to the memory cells in this case are like as the case shown in FIG. 4C.

In the configuration of the save register shown in FIG. 4F, both ends of the cascade-linked memory cells are joined to the bit line BL and, in this case, the data in the memory cell can be saved in the save register during the cyclicly.

The configuration of the save register shown in FIG. 4G illustrates the case where the save register is formed using a SRAM cell.

Figure 5:
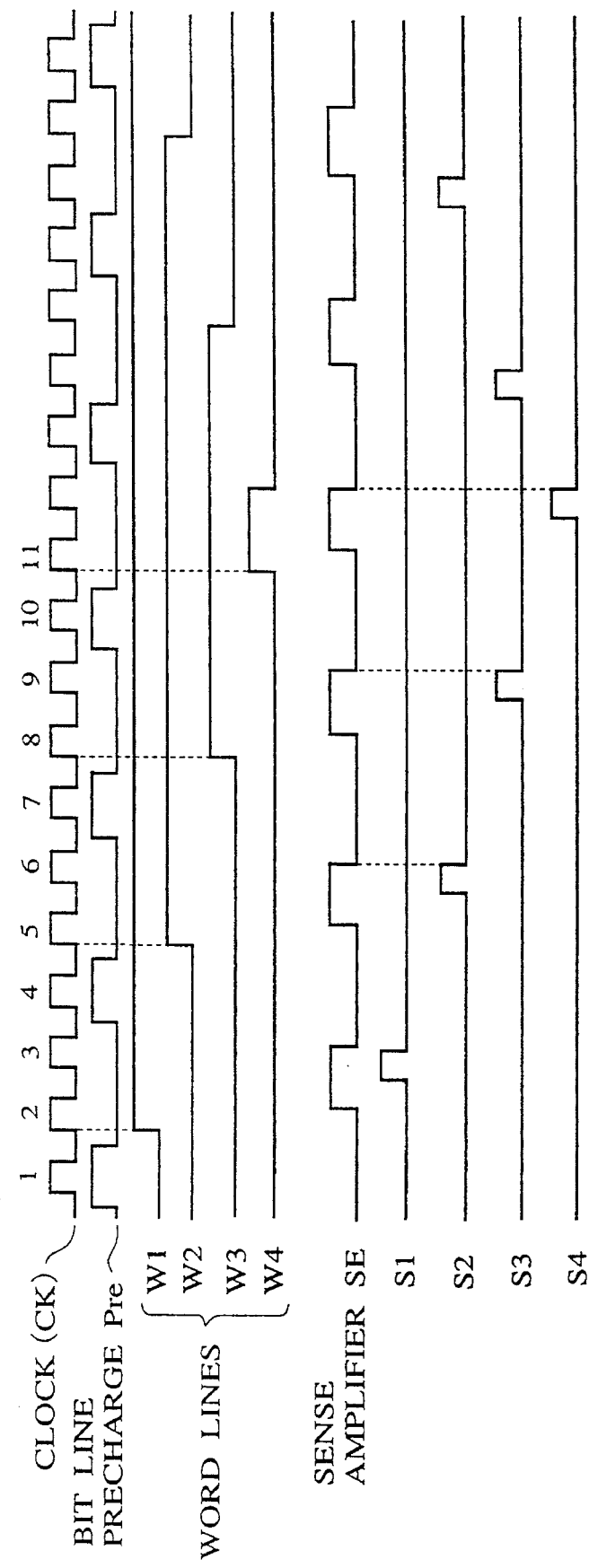
FIG. 5 is a timing chart showing the operation of the memory system shown in FIG. 2A.

FIG. 5 is a timing chart for explaining a synchronous read-out operation for the four cascade-linked memory cells of FIG. 2A and FIG. 3. The timing chart in this drawing shows sense operations for four memory cells 1, 2, 3, 4.

When a row selection signal /RAS is at the low level, one row is selected. Next, when the clock signal CK (clock signal 2) is switched from low to high, one word line w1 is selected, a control signal S1 for a register selection line is switched from low to high by a temporary cell decoder 19, and the data for the memory cell 1 is read out to the sense amplifier (S/A) and stored in a save register r1. In the same manner, the data for the memory cell 2 is written into a save register r2 when a control signal S2 is switched from low to high, the data for the memory cell 3 is written into a save register r3 when a control signal S3 is switched from low to high, and the data for the memory cell 4 is written into a save register r4 when a control signal S4 is switched from low to high.

In this read-out method for these cascade-linked memory cells it is necessary to complete the read-out of an object memory cell (or a target memory cell). The contents are then stored in a sense amplifier (S/A) to complete the read operation. The reason for this is because it is not necessary to read out the data in the next memory cell. In this manner, at the point where the read-out of the object memory cell is completed, a control signal must be transmitted to halt the read-out operation. The control circuit for this action is shown in FIG. 6A.

Figure 6A:
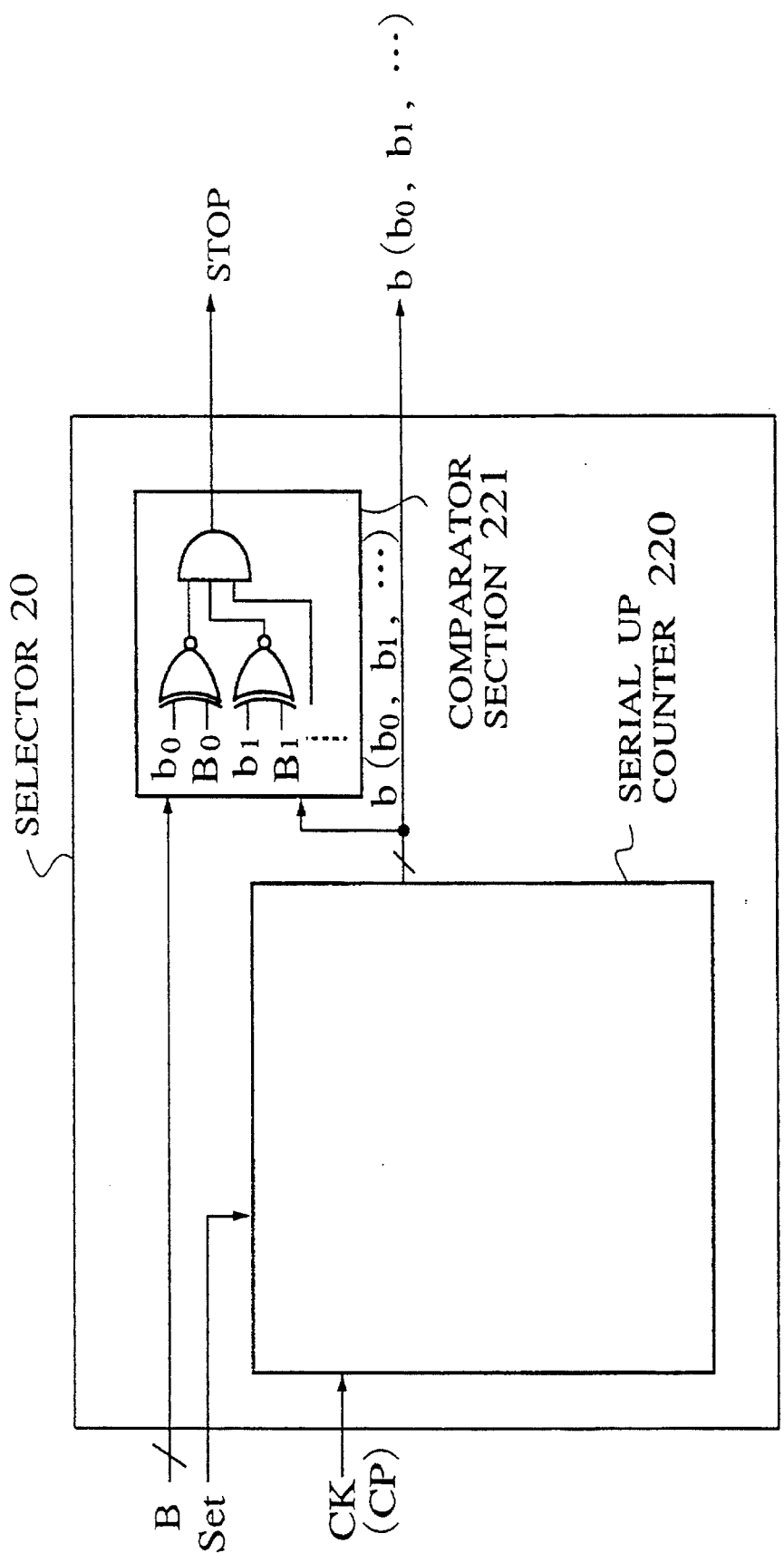
FIG. 6A is a detailed configuration drawing of a selector incorporated in the memory system shown in FIG. 2A.

FIG. 6A is a configuration diagram of a selector 20 for performing this action described above. The selector comprises a serial up counter 220 and a comparator section 221.

First, the serial up counter 220 is initialized by a signal Set (hereinafter called as "a set signal Set"), and when an address B for the object memory cell to be accessed in the synchronous read-out is entered, the serial amplifier counter 220 is counted up, synchronized with the clock signal CK obtained from the division of a basic clock signal by the counter 22.

If the address B of the object memory cell is in agreement with a value b for the serial amplifier counter 220, a stop signal STOP is returned to a controller 21 and a memory system 100 of an external CPU (omitted from the drawing) from the comparator section 221. As a result, the operation of the counter 22 is controlled by the controller 21, and the read-out operation for the memory cell is completed by setting the clock signal CK.

Figure 6B:
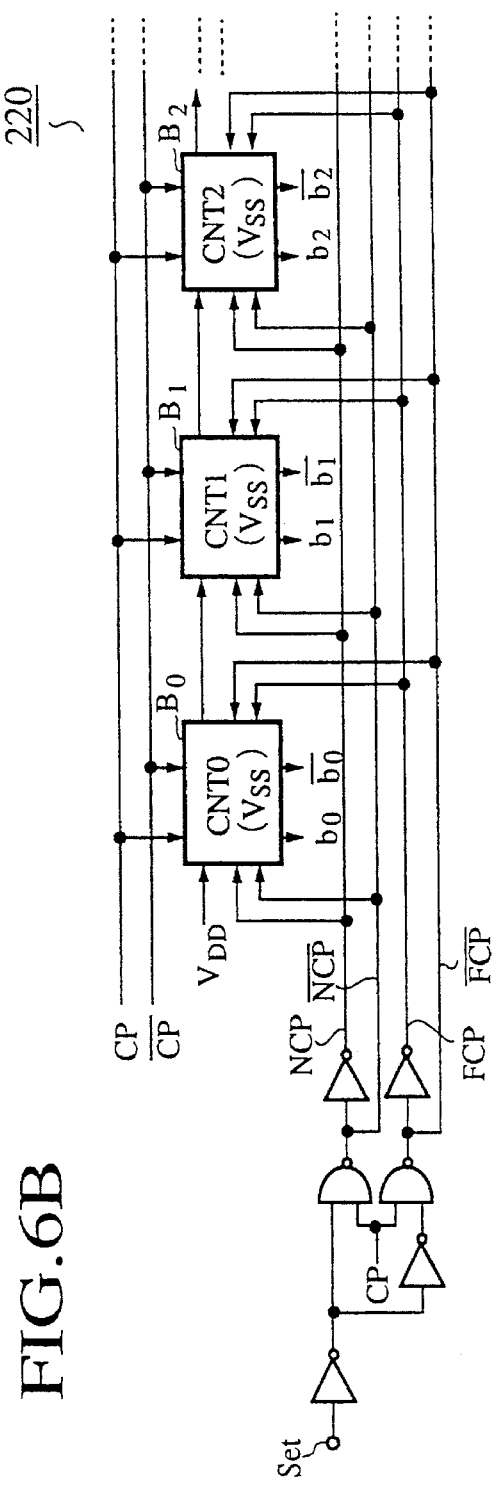
FIG. 6B is a configuration diagram of a serial-up counter incorporated in the selector shown in FIG. 6A.

FIG. 6B is a detailed configuration diagram of the serial up counter 220 incorporated in the selector 20 shown in FIG. 6A.

As shown in FIG. 6B, the serial up counter 220 comprises a plurality of counter CNT (CNT0, CNT1, CNT2, . . . ) which are connected to each other in series. When the serial up counter 222 receives the set signal Set to initialize the serial up counter 222 itself. Then, at receiving the clock signal CK, each CNT (CNT0, CNT1, . . . ) generates and transmits the count result signal b (b0, b1, b2, . . . ) to the comparator 221, the row decoder 18, the transfer decoder 17, and the temporally cell decoder 19 in order to select each of the memory cells 1, 2, . . . , the transfer gate G1, and the save registers r1 to r4. When the count result signal b (b0, b1, . . . ) is agree with the address signal B (B0, B1, . . . ) the comparator section 221 generates the control signal STOP for indicating to halt the sense operation for the memory cells and transmits this control signal STOP to the controller 21 and other external devices. The operation of the selector 20 will be described again in detail later in the explanation of a memory system 200 as the second embodiment of the present invention where the number of memory cells having the cascade-type configuration is sixteen.

Figure 6C:
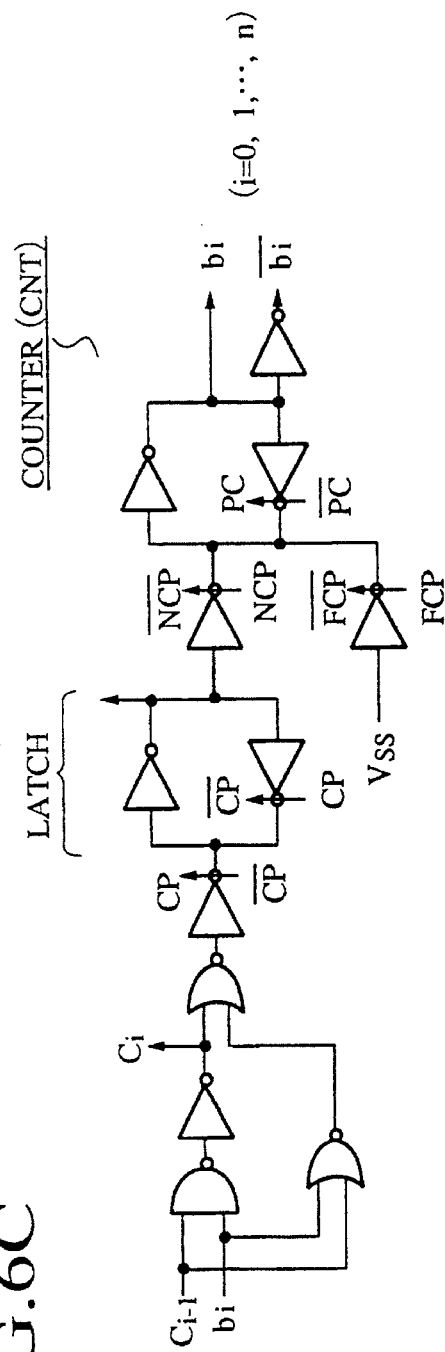
FIG. 6C is a detailed configuration diagram of each counter (CNT) in the serial-up counter shown in FIG. 6B.

FIG. 6C is a configuration diagram of each counter CNT (CNT0, CNT1, . . . ). The counter CNTi (i=0, 1, 2, . . . ) receives the control signal C(C0, C1, . . . ) and count signal bi−1 and generates the control signals bi and /bi. These count result signal b (b0, b1, b2, . . . ) is transmitted to the comparator section 221 and the transfer decoder 17, and the temporally cell decoder 19.

The first embodiment illustrated in FIG. 2A represents the case where there are four cascade-linked memory cells. However, a configuration drawing for a memory system for the case where a memory array made up of a total of four groups where one group contains these four memory cells and is accessed by one sense amplifier (S/A) will now be explained.

Figure 7:
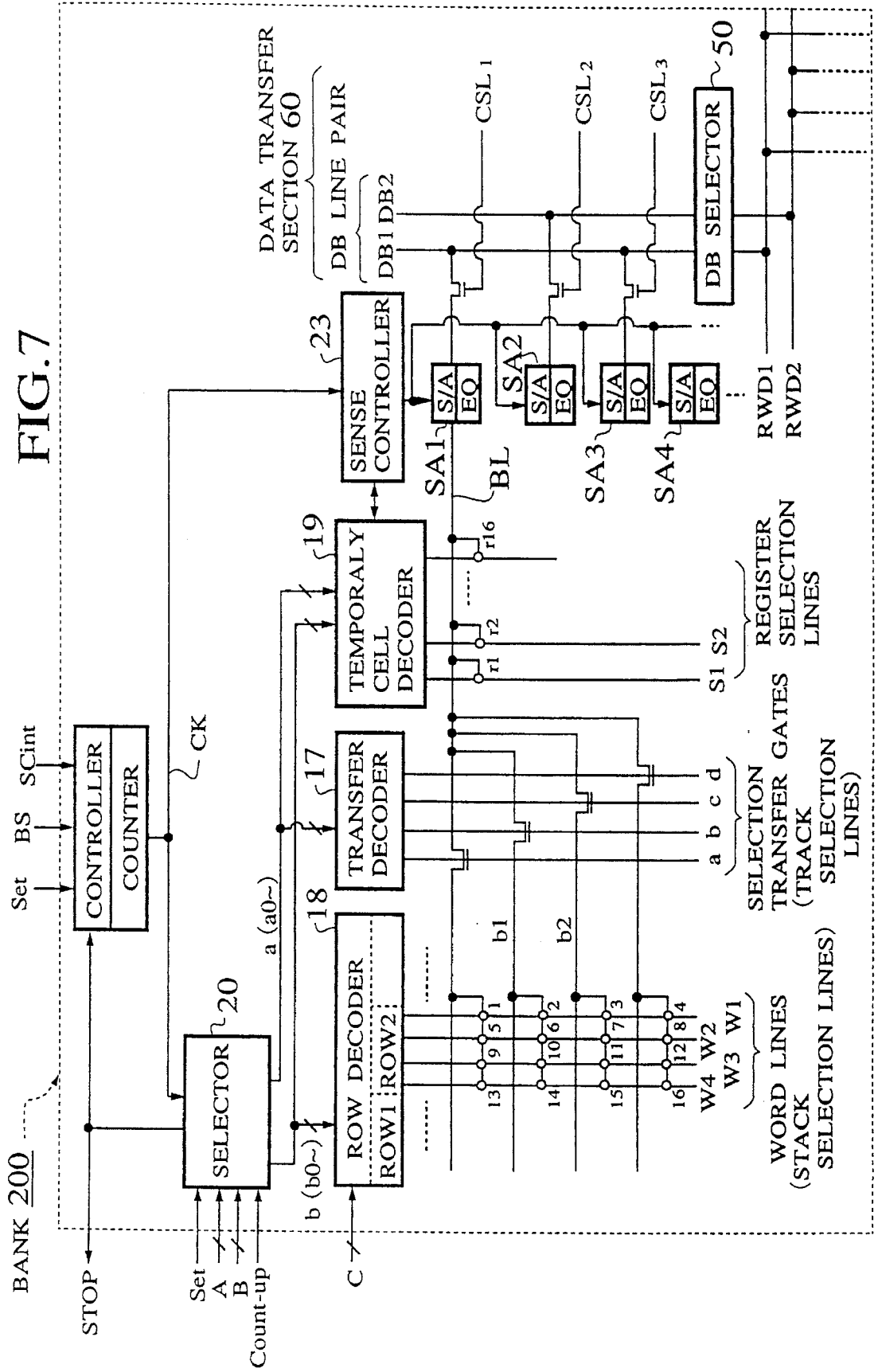
FIG. 7 is a configuration drawing of a second embodiment of a synchronous memory system with a cascade-type memory cell structure of the present invention.

FIG. 7 is a configuration drawing for a memory system 200 with a memory cell bank made up of four groups (16 memory cells). The configuration of the row decoder 18 incorporated in the memory system 200 has been already shown in FIG. 2F which is a plan view of the word line driver units 202-1 to 202-8 in the row decoder 18.

The basic configuration is identical to the memory system 100 illustrated in FIG. 2. For example, each of the memory cell groups (1, 5, 9, 13), (2, 6, 10, 14), (3, 7, 11, 15), and (4, 8, 12, 16) has the same configuration of the memory cell group as shown in FIG. 2A. In addition, the number of the save registers is sixteen or fifteen. The basic configuration of the save registers r1 to r16 are as same as that of the save register shown in FIGS. 4A to 4G. Therefore, detailed descriptions for the configuration of the memory cells and the save registers are omitted from this description for the second embodiment of the present invention.

A selection transfer gate 17 for selecting each memory cell group connected to the sense amplifier S/A is provided as a new structural element because the number of the memory cell groups is four in this embodiment.

In the memory system 200 of this embodiment, a plurality of memory cells are divided into several groups of memory cells belonging to a plurality of rows. For example, the row decoder 18 selects the row 2 by means of an externally-provided control signal C (row indication signal).

Sixteen memory cells (1, 2, . . . , 16) made up of four groups of memory cell arrays belong to the row 2.

Each of the memory cells (1, . . . , 16) belonging to the row 2 is selected by control signals A, B entered into a selector 70.

External control signals entered into the memory system 200 include a group of four control signals for count-up and the like. There are the system clock signal SCint, the control signal Set for initialization, the control signals C (C0, . . . ) for specifying the row, the control signal A (A0, . . . ) for specifying a track in the row, and the control signals B (B0, . . . ) for specifying a stack in the row.

These control signal groups are used for specifying read-out operations from memory cells and for specifying memory cells which are objects of a restore operation.

The externally-provided system clock signal SCint is entered into the counter 22, and, the counter 22 is initialized at an initial value (for example, "0") when the set signal is entered synchronized with the system clock signal SCint.

Subsequently, the system clock signal SCint is counted, and the transmission clock signal CK is obtained based on the count (specifically, obtained by dividing the system clock signal SCint) and supplied to the selector 70 and the sense controller 23.

One group of four memory cells 1, 5, 9, 13 among the memory cells (1, . . . , 16) belonging to the row 2, is connected to the bit line b1.

The memory cells (1, . . . , 16) in the row 2 are specified by the control signals A, B, C which have been entered from an external source. Specifically, they are selected by the row decoder 18 as memory cells belonging to the row 2 synchronized with a transmission clock signal CK obtained by dividing the basic clock signal supplied from the counter 22.

The sensing method for the memory cells with a cascade-type cell structure of the memory system 200 with the above-described configuration will now be explained in detail from the viewpoint of that class of memory access.

In order to activate (open) a certain word line and access a memory cell belonging to that word line, the address space must be divided into several classes.

Figure 8:
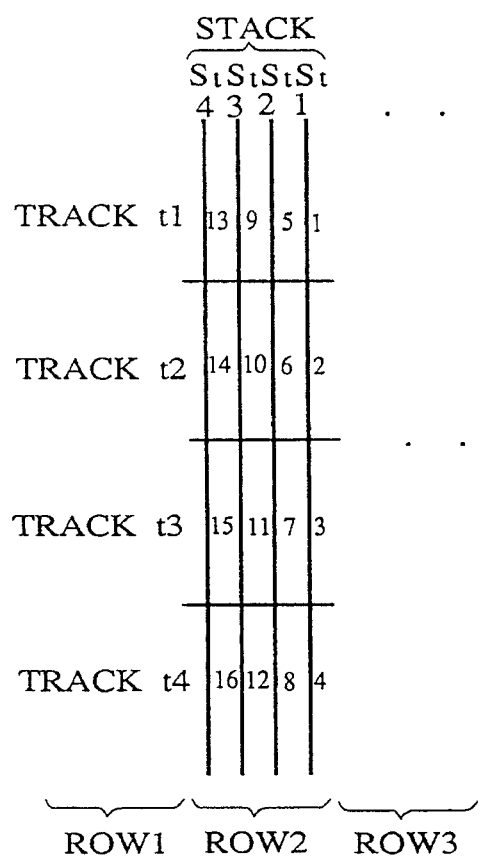
FIG. 8 is a hierarchal configuration drawing of a memory cell bank in the memory system shown in FIG. 7.

FIG. 8 shows one example of an address space. In this example sixteen memory cells (1 to 16) are formed into a memory cell array.

In FIG. 8, one row is divided into four stacks (St1, St2, St3, St4) and four tracks (t1, t2, t3, t4). Specifically, in the cell shown in FIG. 7, the memory cells (1, 2, 3, 4) belong to the stack (St1); the memory cells (5, 6, 7, 8) to the stack (St2); the memory cells (9, 10, 11, 12) to the stack (St3); and the memory cells (13, 14, 15, 16) to the stack (St4).

In addition, the memory cells (1, 5, 9, 13) belong to the track (t1); the memory cells (2, 6, 10, 14) to the track (t2); the memory cells (3, 7, 11, 15) to the track (t3); and the memory cells (4, 8, 12, 16) to the track (t4).

The four word lines (w1, w2, w3, w4) in the memory system shown in FIG. 7 are selected by one stack. That stack can select any of these word lines. To select a track, any of a group of selection transfer gates (a, b, c, d) is selected by the transfer decoder 17.

The access times necessary to select the different stacks differ. Specifically, a different access time is required for each of the stacks. Among these, a characteristic access time difference is produced in sensing the cascade type cells.

To give one example, we will consider the case of the memory cell 10 for the stack (st3) and the track (t2) in the row 2 First, it is necessary to provide a data read-out transmission path in order to transfer the data in the memory cell 10 to an external destination.

In addition, memory cell data destroyed during the data read-out operation, specifically, data in the memory cells (1 to 8) which are on the data read-out transmission path, must be temporarily stored in restore registers (r1, . . . , r16) through this data read-out transmission path.

In the same manner, when a word line is not opened and a sensing operation not performed, the data contained in the memory cells (9, 11, 12) is half-destroyed therefore this data must also be temporarily stored in the restore registers (r1, . . . , r16). These operations will now be explained.

First, to access the stack (st1), bit lines Bi, /Bi are equalized by the sense amplifier (S/A) and the word line (w1) is switched from low to high.

Then, to access the track (t1), the selection transmission gate (a) is switched from low to high, and the data in the memory cell 1 in the row 2 is transferred to the bit line Bi.

The bit line /Bi stores a reference level for the sense amplifier. After sensing is completed, a register selection line (s1) is switched from low to high by the temporary cell decoder 19, and this data is stored in the register r1.

Next, the register selection line (s1) and the selection transmission gate (a) are closed, and after the bit line Bi is equalized, the selection transmission gate (b) is switched from low to high to access the track (t2). The register selection line (s2) is also switched from low to high, and the data in the sense amplifier (S/A) is stored in the register (r2). These operations are repeated successively.

When a different Stack is selected, for example, when a change is made from the Stack (St1) to the Stack (St2), the new word line (w2) is also switched from low to high.

In the same manner, by selection of the memory cell 10 so that this cell is accessed last, all the data in the memory cell 1, . . . , 10 to be stored is stored in the restore registers (r1, . . . , r10).

While maintaining this state, the data in the memory cell 10 is stored in the sense amplifier (S/A). In this state, column access is performed for the sense amplifier (S/A).

Next, when a new and different stack and track are selected, a sensing operation is implemented for the data in this selected memory cell from the current access state by the shortest operation.

Specifically, if data is newly read out of the object memory cell as far as the stack (st3) in the same row, the corresponding restore register is selected for the data in this memory cell, this data is sensed, and is stored in the sense amplifier (S/A).

In addition, when a memory cell belonging to an even deeper stack (a stack with a larger number) is accessed, for example, the memory cell 15 belonging to the stack (st4) or the like, the word line (w4) is also activated, and the data in the object memory cell is stored in the sense amplifier (S/A) by implementing the above-mentioned sensing operation repeatedly.

Accessing a memory cell belonging to a new row, for example, a row other than the row 2, requires the most time.

This is because after the data sensed and stored in the restore registers (r1, . . . ) up until this time is all rewritten into the memory cells (restore operation), the above-described sensing operation must be implemented for a new row.

In a rewrite operation, the restore register which stores the data in the memory cells dependent on the deepest open stack (the stack with the largest number) is opened, the details of that stored data is sensed, and the selection transmission gate for a memory cell belonging to the corresponding track is closed.

This is implemented for the selection transmission gates for all the memory cells belonging to the corresponding track, and when switched to the next deepest stack, the word line corresponding to the deepest stack is closed. This operation is implemented for all the read-out cells.

From the explanation of the memory cell access operation and the sensing operation for the memory system 200 of a second embodiment shown in FIG. 7, the amount of time required for access when a certain row, stack, and tack is selected differs considerably, depending on the sensing conditions when the access took place and the depth of the stack accessed.

A time of about 100 ns is required for one sensing operation. Therefore, in the worst case, that is, the case in which the most time elapses, 16×100×2 ns, that is, about 3.2 μs are required for a restore operation and a new sensing.

Next, a column access method will be explained. Column access is a synchronous access method. Grouped data items are transferred in a fixed sequence, synchronous with an external clock signal used for entering an address signal, so that it is possible to transfer data with a high-speed cycle.

Figure 9:
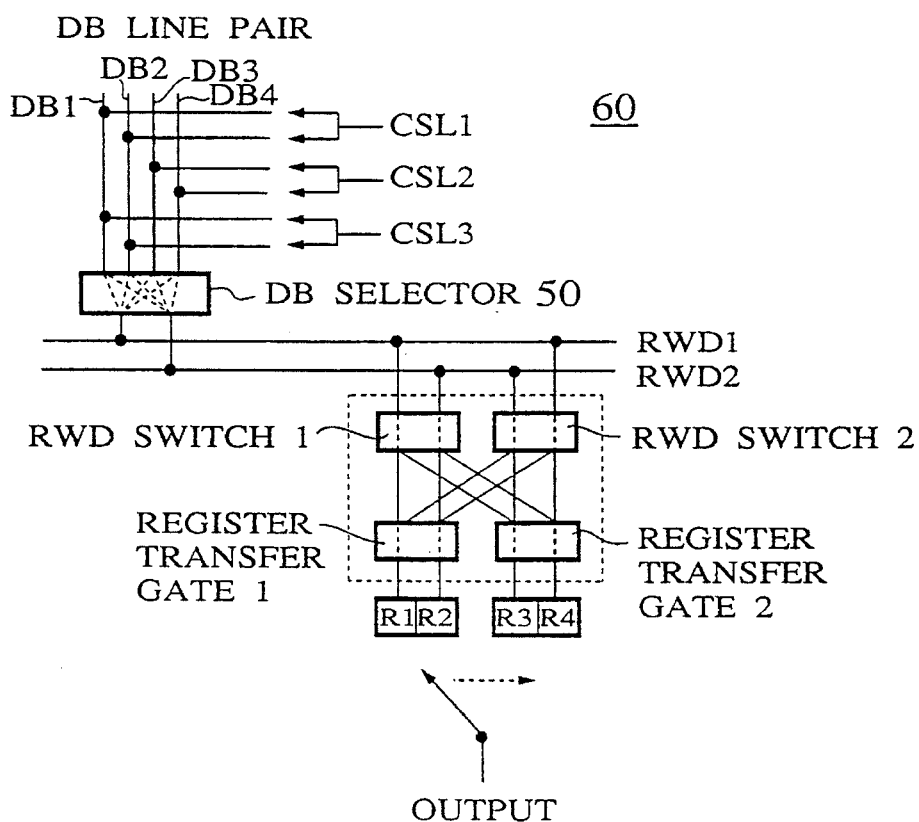
FIG. 9 is a configuration drawing of a data transfer section in the memory system shown in FIG. 7.

FIG. 9 is a configuration drawing of a data transmission section 60 for a data transmission path for transferring data from the sense amplifier (S/A) shown in FIG. 2 and FIG. 7 until that data is transmitted to an external section from the memory system 100, 200.

In this drawing, DB lines (DB1, DB2, DB3, DB4) are data lines for transmitting data from the sense amplifier (S/A), and CSL1, CSL2, CSL3, and the like are signals for selectively turning ON transmission gates connected between the data lines DB (DB1, DB2, DB3, DB4) and the sense amplifier.

Normally, by selecting adjacent signals (CSL (for example, CSL1 and CSL2, or CSL2 and CSL3), four pieces of data are transmitted every second cycle of column access from the four sense amplifiers (SA1, SA2, SA3, SA4) to the DB line pairs (DB1, . . . , DB4).

FIG. 2C is the configuration diagram of the DB selector 50. The DB selector 50 selects a pair of DB lines from the four DB lines suitable for column addressing and transmits the data to a pair of signal lines RWD1, RWD2. The two units of data are stored alternately in a pair of output registers R1, R2 or R3, R4. The corresponding linking of the output registers R1 and R2 or R3 and R4, and the signal lines RWD1 and RWD2 as a result of this addressing is implemented by selectively turning ON either an RWD switch 1 or an RWD switch 2.

Specifically, when the data is stored in the output register pair R1, R2, a register transfer gate 1 is opened, and if the RWD switch 1 is ON, the signal line RWD1 and the output register R1 and the signal line RWD2 and the output register R2 are joined.

If the RWD switch 2 is ON, the signal line RWD1 and the output register R2 and the signal line RWD2 and the output register R1 are joined.

The transfer of data to an output terminal OUTPUT is implemented by normally scanning from the output register R1 to the output register R4 in sequence.

Data transmission to the output registers (R1, ... R4) is executed once every two output cycles, and the addressing to determine the output sequence of the data to the output registers (R1, ... R4) is performed by storing the data in the sequence in which the data is transmitted to the output registers.

In this manner, a highly efficient I/O operation can be implemented by utilizing the column access method according to the configuration of the above-mentioned memory system 200.

In addition, if the data in the object memory cell from among memory cells belonging to a certain row is the last read out to the sense amplifier (S/A), highly efficient data access can be implemented regardless of the position of that memory cell within the memory bank.

Next, one of the features of the present invention is that the read-out operation is halted at the point where the read-out of the object memory cell is completed. A control method for storing that data in the sense amplifier will now be explained.

Figure 10A:
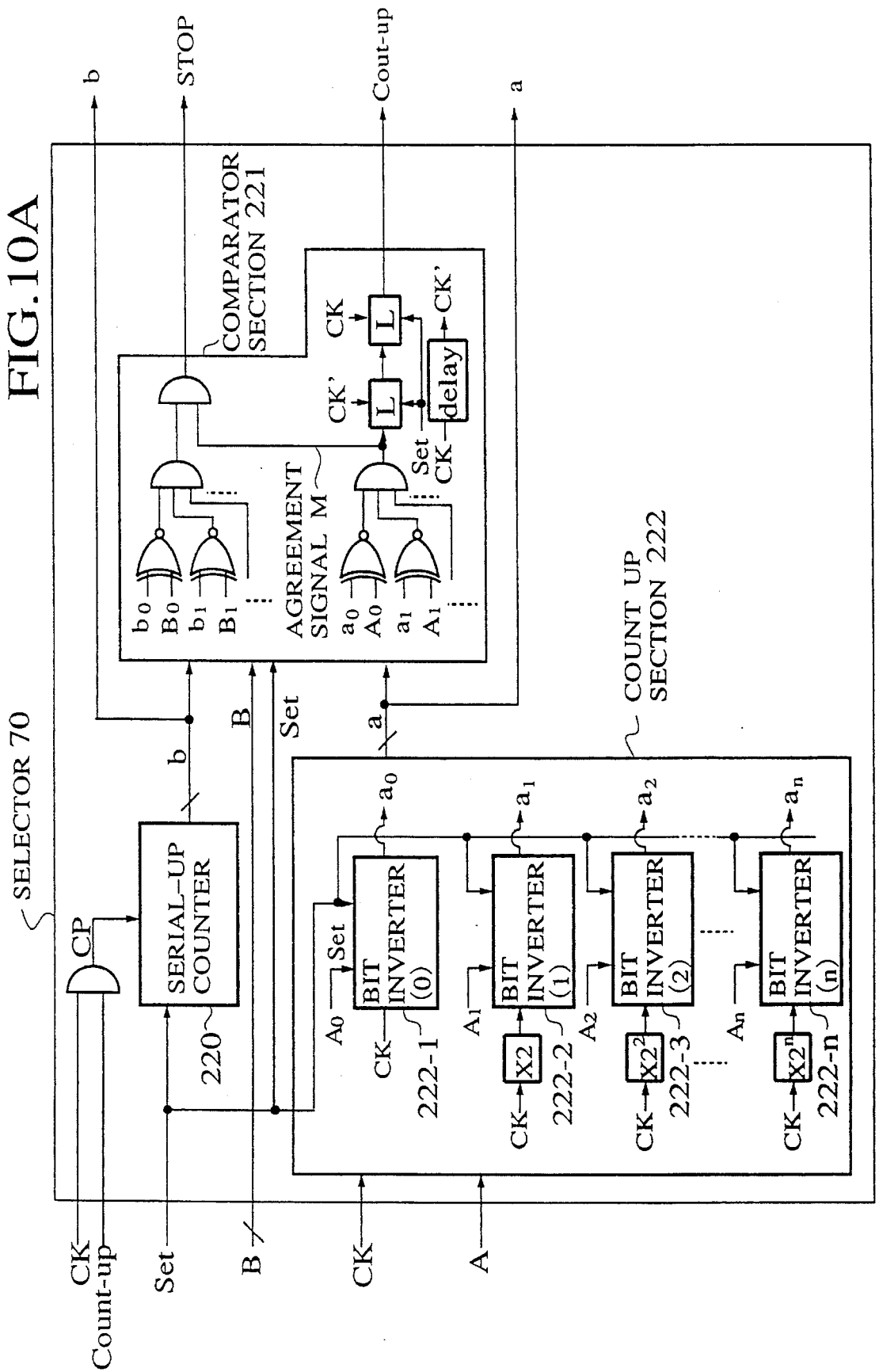
FIG. 10A is a configuration drawing of a selector including a counter in the memory system shown in FIG. 7.

FIG. 10A is a detailed configuration drawing of a selector 70 incorporated in the memory system 200 shown in FIG. 7. The selector 70 is a circuit for adjusting the sequence for reading the memory cells so that the object memory cell is the last read out to the sense amplifier (S/A) in data accessing.

In this drawing, the selector 70 comprises a serial-up counter 220, a count-up section 222, and a comparator section 221. The configuration of the serial-up counter 220 is shown in FIGS. 6B and 6C which have been already described.

The serial-up counter 220 is initialized to a value "0" by the entry of an external control signal Set. Subsequently, a count-up is made for every entry of a count-up signal synchronized with the transmission clock signal ck, and a count result b (b0, b1, ...) is transmitted. The count result b is received by the comparator 221 together with a control signal B (B1, B2, ...) which is transmitted from an external source.

Figure 10B:
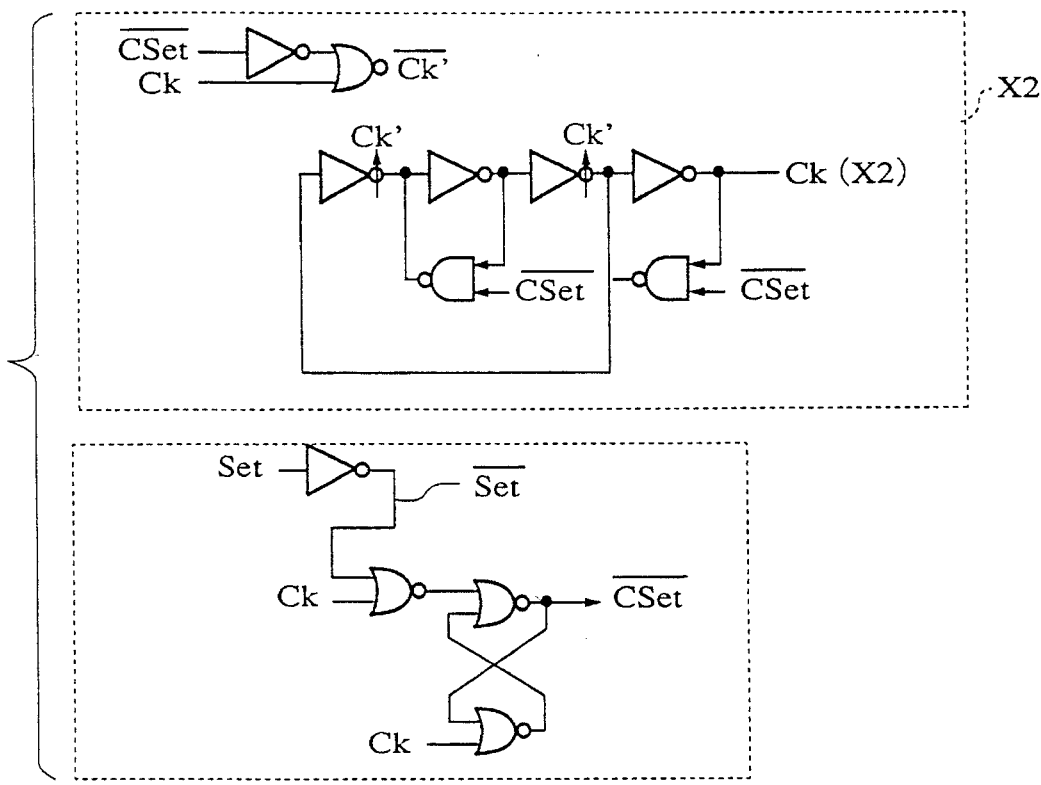
FIG. 10B is a configuration diagram of a counter clock generator incorporated in the selector shown in FIG. 10A.

FIG. 10B is a configuration diagram of the counter clock generator X2 in the count-up section 222. The counter clock generator X2 receives the control signal SET provided from externally and generates a clock signal ck (X2). The counter clock generator $X2^n$ receives the control signal An, the clock signal CK, and the control signal SET, and then generates address bit $a_n$ to the comparator section 221 and external devices such as the temporally cell generator 19.

Figure 10C:
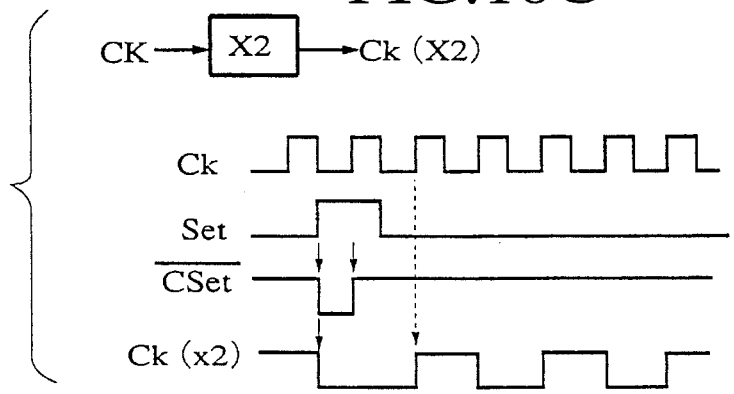
FIG. 10C is a timing chart of the operation of the counter clock generator (X2) shown in FIG. 10B.

FIG. 10C is a timing chart of the relationship among the clock signal CK, the control signals SET, /CSet, and the clock signal (X2). The clock signal (X2) is the output clock signal from the counter clock generator (X2). In this timing chart, the output clock signal (X2) has a period which is twice of the period of the clock signal CK.

Figure 10D:
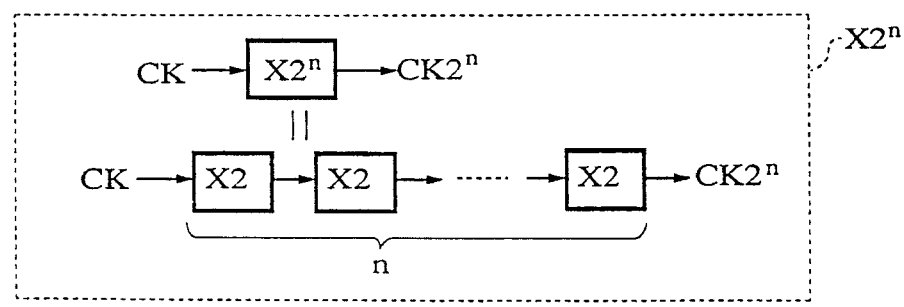
FIG. 10D is a block diagram of a counter clock generator (X2") connected in series shown in FIG. 10A.

FIG. 10D is a configuration block diagram of the counter clock generator $X2^n$. In this case, the n counter clock generators X2 shown in FIG. 10B are connected in series. The counter clock generator $X2^n$ generates and transmits the output clock signal $CK2^n$ to the bit inverter (BIT INVERTER) shown in FIG. 10A. The output clock signal $CK2^n$ has a time period which is n times of the time period of the clock signal CK.

Figure 10E:
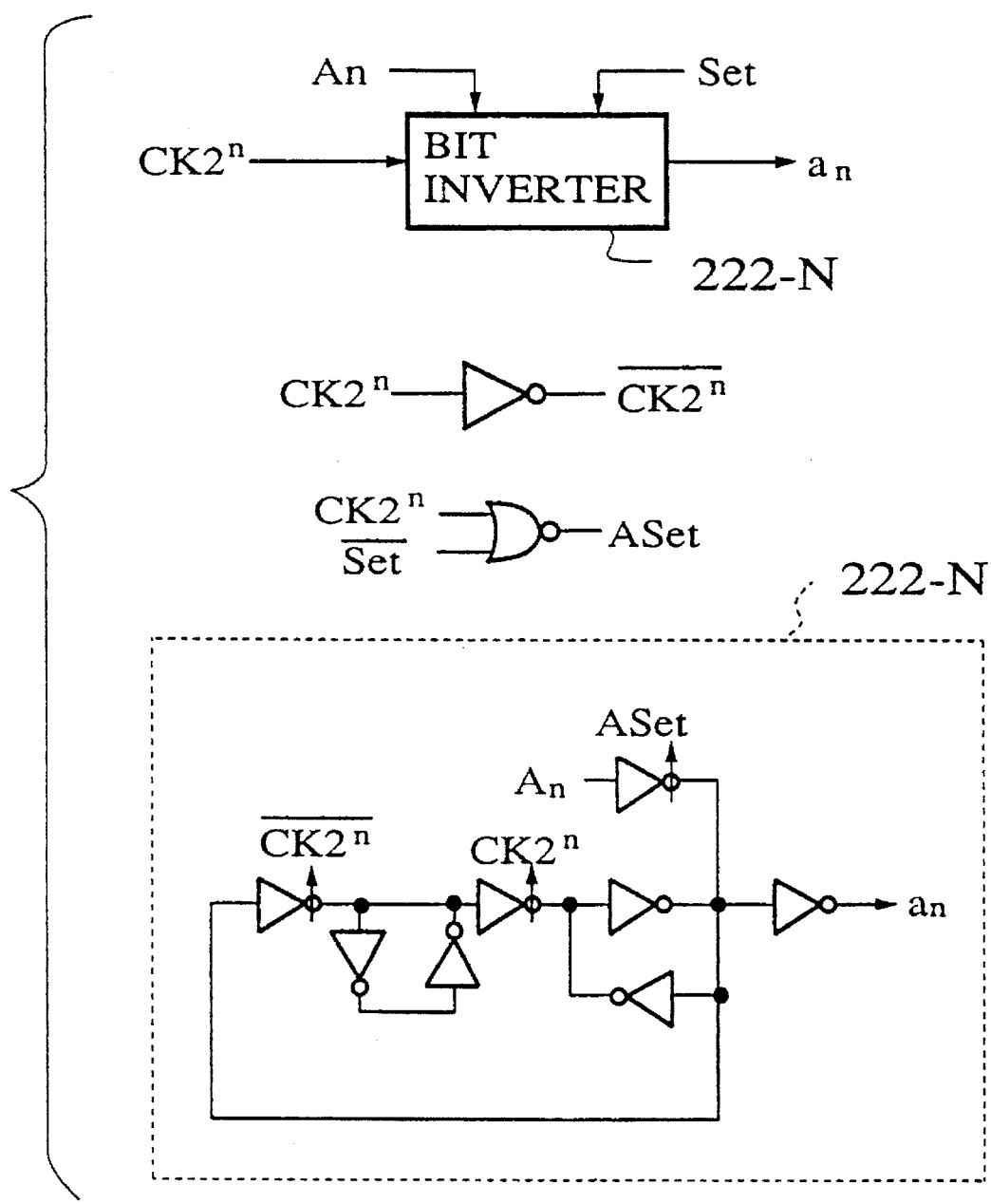
FIG. 10E is a configuration diagram of a bit inverter incorporated in the selector shown in FIG. 10A.

FIG. 10E is a configuration diagram of each of the bit inverters (222-1, 22-2, 222-3, ... ,222-N) incorporated in the count-up section 222. As shown in FIG. 10E, the bit inverter (222-N, N=0, 1, ..., n)) receives the control signal SET, the output clock signal $CK2^n$ (n=0, 1, ..., n), and the address bit An and generates a value "an" to the comparator section 221 and external devices such as the temporally cell decoder 17.

When the count result b transmitted from the serial-up counter 220 is entered into the comparator 221, compared with the control signal B, if those values are in agreement while an agreement signal is activated, a stop signal STOP is transferred to the controller 21 and a device external to the CPU or the like (omitted from the drawing). The controller 21 halts the clock operation of the clock signal CK by means of this STOP signal.

FIG. 11 is a view for explaining the operation up to the transmission of the signal STOP by the selector 70.

The values of address bits a0, a1 for the selection transmission gates a, b, c, d shown in FIG. 7, corresponding to the tracks t1 ... t4 are (0, 0), ... (1, 1) as shown in FIG. 11. A cell at track t3, stack st3, equivalent to the cell 11 in FIGS. 7 and 8 is taken as the object memory cell from which data is to be read out. The value of the address bit a0, a1 for this object cell is (0, 1), therefore a0=0, a1=1 are set as the initial values in the count-up section of each bit inverter by entering the control signal Set.

The values (a0, a1) are considered as an externally-obtained address A for bits A0, A1. In the explanation of FIG. 11, there are four tracks, therefore two bits are acceptable as this address, and no bit inverter exists after a bit inverter 222-3 in the count-up section 222 shown in FIG. 10A. Each of the bit inverters inverts its bit in synchronism with the clock signal CK. In this case, the inversion of the lowermost bit inverter 222-1 occurs at every cycle of the clock signal CK, for the next bit inverter 222-2, at every second cycle of the clock signal CK, and, in addition, if there is a bit inverter 222-3, ..., 222-n, for the bit inverter 222-3, at every fourth cycle of the clock signal CK, the bit inverter 222-n, at every $2^n$ cycle of the clock signal ck. Accordingly, as shown in FIG. 11, the address bits (a0, a1) are changed from the initial values, and the address bits (a0, a1) are in agreement with the initial values (0, 1) at the fourth cycle of the clock signal CK.

In FIG. 11, if the values (a0, a1) of the signals transmitted from the count-up section 222 in FIG. 10A is the same as the initial values (0, 1), an agreement signal M is generated in the comparator 221. At that time, if the output b of the serial-up counter 220 agrees with each bit of the control signal B indicating the address of the stack belonging to the object memory cell, the stop signal is generated. The agreement signal M passes through two latch circuits (designated by "L" in the comparator section 221 in FIG. 10) and then transmitted as the count-up signal at a next clock cycle after the clock cycle of generating the agreement signal M. This count-up signal is received by the serial-up counter 220, together with the clock signal CK, and the serial up-counter 220 performs a count-up operation.

Further, each of the two latch circuits (L), which generate the count-up signal from the agreement signal M, comprises a circuit latches, stores, and transmits data when a clock signal CK' which is a delayed clock signal CK and the clock signal CK are switched from low to high. When the next cycle of the clock signal CK at which the signal M has been changed is switched from low to high, this agreement signal M is transmitted as a count-up signal.

When the count-up section 222 and the serial-up counter 220 transmit outputs for the address A, B of the track, stack of the object memory cell, the comparator section 221 in the selector 70 transmits a stop signal to the controller 21 and a device external to the CPU or the like (omitted from the drawing) to terminate the transmission operation.

As described above, a0=0 and a1=1 are set in the bit inverters 222-1, 222-2 shown in FIG. 10A. At the fourth cycle of the clock signal CK, the value in the memory cell C (0, 1) to be accessed and that set value are in agreement, therefore, the agreement signal M generated in the comparator section 221 and the count-up signal (Count-up) transmitted from the comparator 221 becomes the fifth cycle. Here, a CP signal is generated at the internal section of the selector 70, the serial-up counter 220 counts up, and the specification of the stack is incremented by 1.

The output signal b (b0, b1, . . . ) of the serial-up counter 220 is transferred to the row decoder 18 and the temporary cell decoder 19 to select a word line and a register selection line.

As shown in FIG. 10A, in the count-up section 222, a control signal (or an address signal) A (A0, A1, . . . ) supplied from an external source is received by the bit inverter (222-1, 222-2, . . . ), and a count signal a(a0, a1, a2, . . . ) is transmitted to the comparator section 221.

This count signal a is transmitted to the transfer decoder 17 and the temporary cell decoder 19 to select a selection transfer gate and a register selection line.

Figure 12:
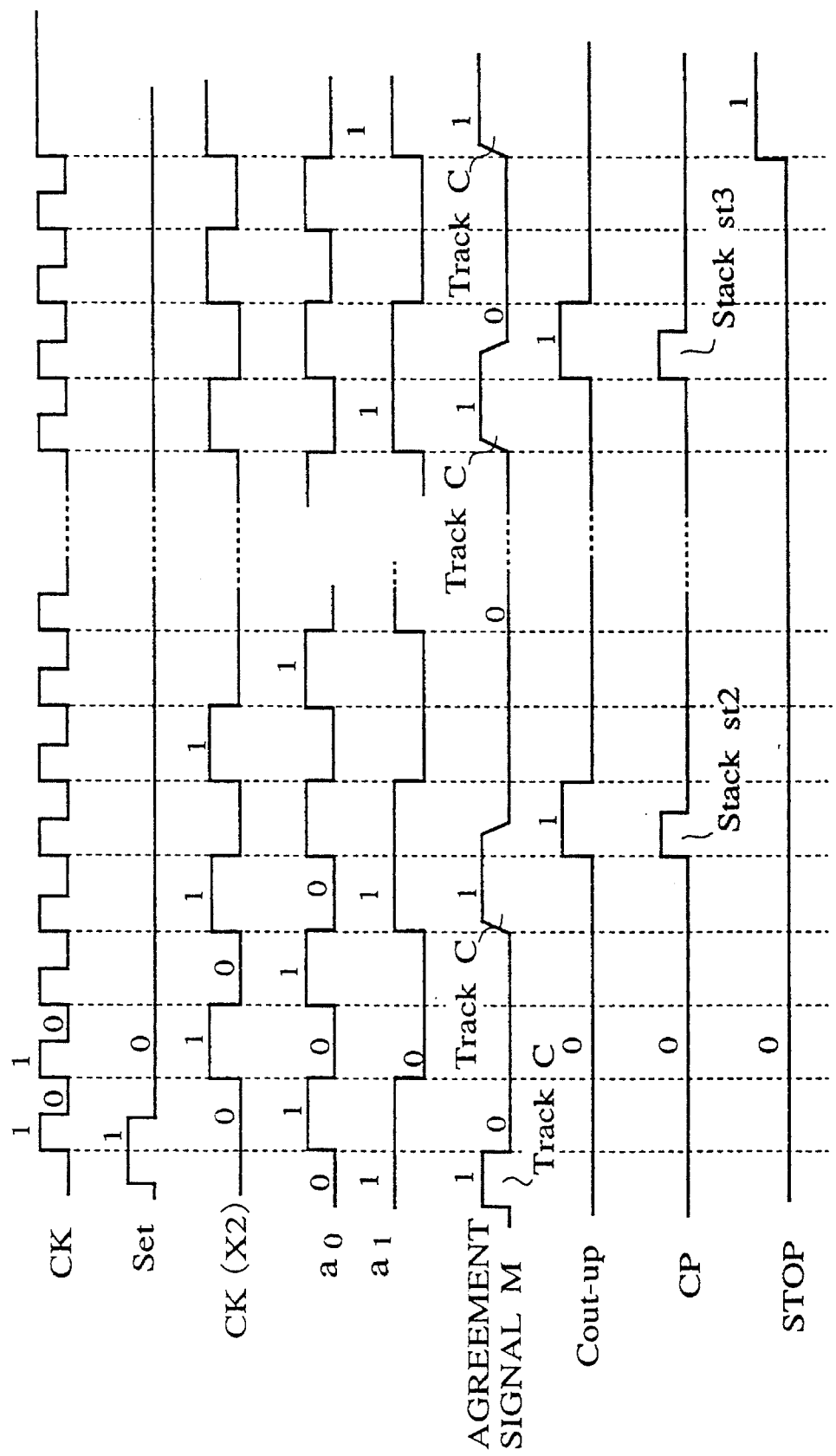
FIG. 12 is a timing chart for explaining the operation of the selector shown in FIG. 10A.

FIG. 12 shows a timing chart for the selector 20 shown in FIG. 11 up to the transmission of the stop signal Stop. In FIG. 12, the address B, A indicating the stack and the track of the object memory cell is entered by the signal Set. The count signals or values a0, a1 are initially set at (0, 1) in the example of FIG. 11. The cycle for the clock signal CK is also commenced at the signal Set. The clock signal CK (x 2) inverts the a1 bit at an internal clock signal which changes every second cycle of the clock signal CK. The bits (or count signals) a0, a1 are inverted according to the respective clock signal CK, CK(x2), and the agreement signal M becomes "1" at the cycle of the clock signal CK which agrees with the initial setting (0, 1). This occurs every four cycles.

At the next cycle, the count-up signal is "1". As a result, while the clock signal CK is "1", the signal cp is "1" to count up the counter of the address b designating the stack, and the word line gradually switches from low to high toward the stack which belongs to the object memory cell.

In this example, the stack which belongs to the object memory cell is the stack St3. Advancing to the last stack, a stop signal STOP is generated by the comparator 221 when A0, A1 and a0, a1, B0, B1 and b0, b1, . . . are in agreement.

The stop signal STOP is transmitted to the controller 21 shown in FIG. 7, and the generation of the clock signal CK by the counter 22 is halted. In FIG. 12, after the signal STOP becomes "1", the clock signal CK is fixed at "1". As a result, the contents of the object memory cell are stored in the sense amplifier.

As outlined above, in the memory systems 100, 200 of the first and second embodiments of the present invention, initially, after the address signal for selecting the memory cell, is entered in synchronism with the system clock signal SCint, there is no necessity for providing separate clock signals to control the specifying of the memory cells in the same row (for example, in the case of the row 2 shown in FIG. 7, there are the sixteen memory cells (1, . . . , 16)).

In addition, a CPU or the like does not necessarily supervise the timing from the entry of the address signal synchronized with the clock signal up to the commencement of the transmission operation because of the feature by which it is possible to implement data access synchronized with the clock signal CK obtained by dividing the basic clock signal. As a result, the load of the CPU can be reduced, and, the CPU can perform another operation at that time.

Figure 13:
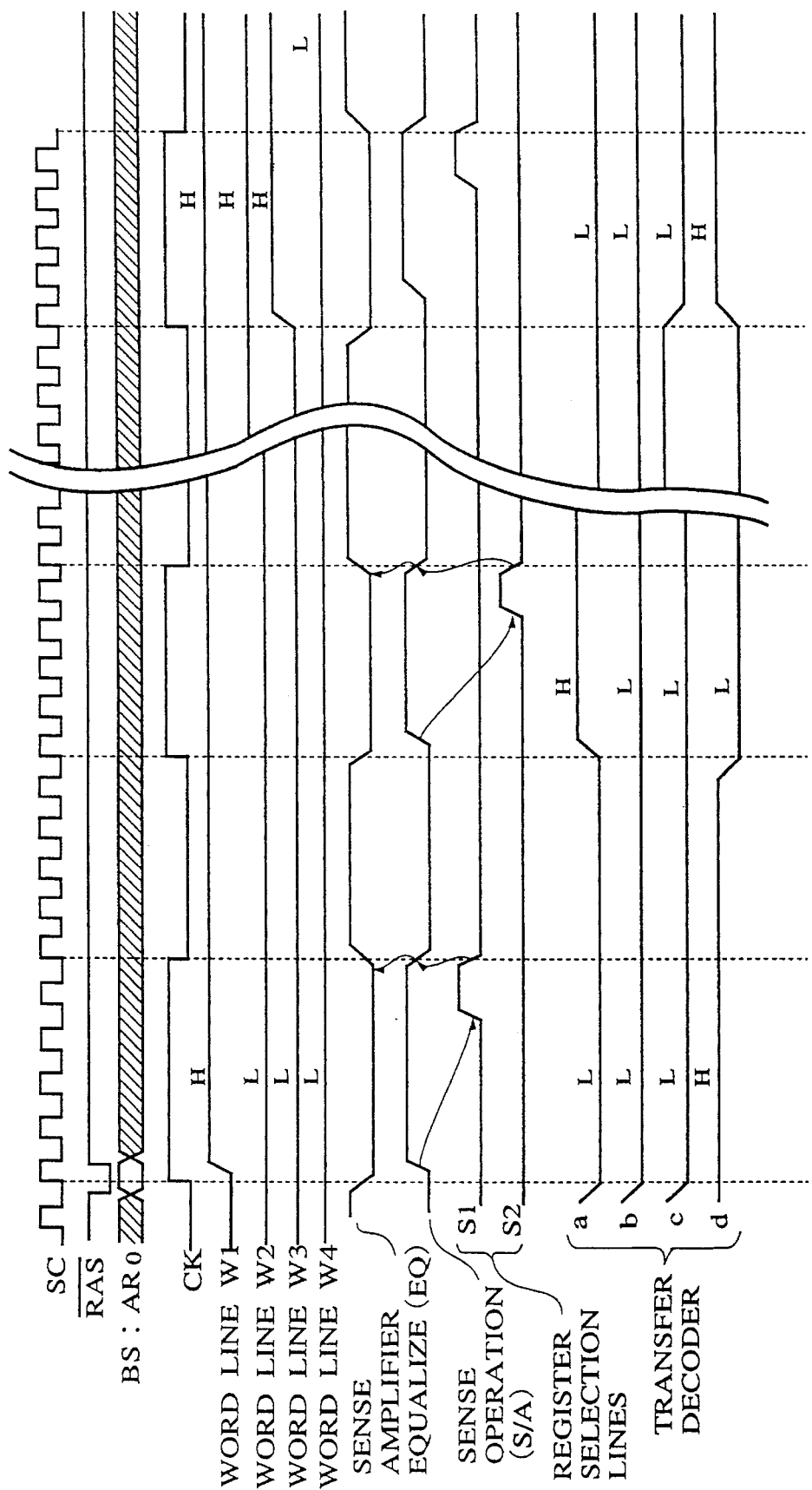
FIG. 13 is a timing chart for explaining the operation of the memory system shown in FIG. 7.

FIG. 13 is a timing chart for the operation of the memory system 200 of the second embodiment illustrated in FIGS. 7 to 12.

In FIG. 13, the left half of the timing chart illustrates the condition wherein the cells (4, 1, 2, 3) of the track belonging to the stack St1 (word line w1) are read out of the selection transfer gate d first. The selection transfer gates a, b, c, d prior to the operation of the word line and the sense amplifier are all at the high level ("H") and the bit line has already been precharged.

In the example of FIG. 11, the selection transfer gate d is first selected, therefore, after d reaches the high level ("H"), the transfer gates a, b, c are selected as the gates in that order.

Next, in the right half, the condition wherein the cells (12, 9, 10, 11) of the track belonging to the stack St3 (word line w3) are read out of the selection transfer gate d first is illustrated. With the word lines w1, w2 remaining at the high level ("H") the word line w3 is switched from low to high and another operation is performed in the same manner as the right side.

A third embodiment of the present invention will now be explained with reference to the drawings.

The configuration of a memory system effectively using the special features of the memory system 200 with a cascade-type cell structure of the second configuration illustrated in FIG. 7 will now be explained.

A memory system 400 of this third embodiment has a plurality of memory groups (banks) formed from banks of memories which can be accessed independently.

Figure 14:
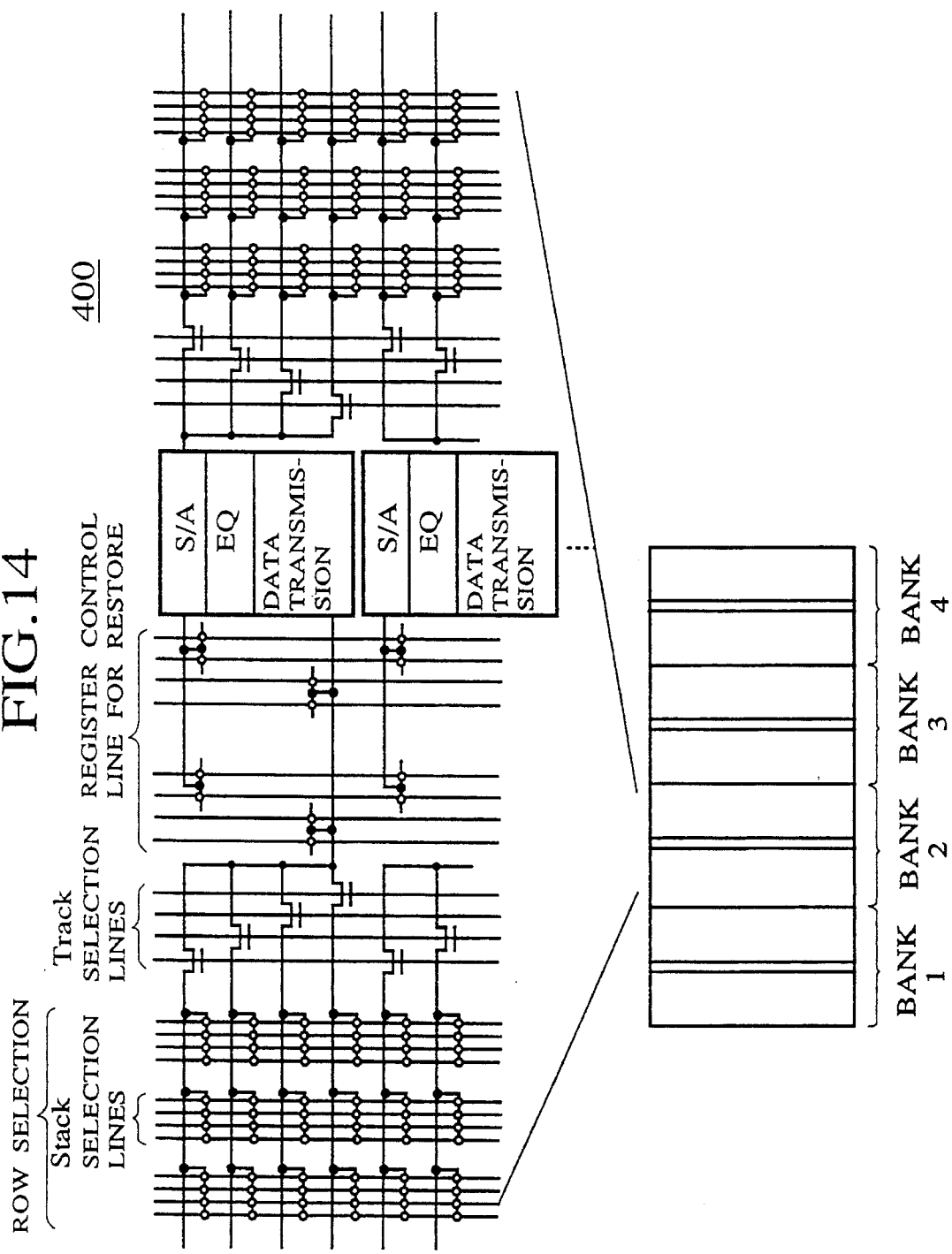
FIG. 14 is a configuration drawing of a third embodiment of a multi-bank memory system with a cascade-type cell structure of the present invention.

FIG. 14 is a configuration drawing of a memory cell array in the memory system 400 of the third embodiment made up of a plurality of banks.

An example of a four-bank configuration (banks 1, 2, 3, 4) for the memory system 400 of the third embodiment shown in FIG. 14 is illustrated. Each bank has a configuration as shown in the drawing. Specifically, each bank has the configuration of the memory cell presented in the memory system 200 of the second embodiment shown in FIG. 7.

The various sense amplifiers (S/A) are connected to a pair of DB lines in the data transmission section 60 shown in FIG. 2 and FIG. 7, accessed to column direction.

Each bank can be accessed independently as a cascade-type memory chip. The wide variation in the amount of time required for the row access operation produced in the case of a different stack is eliminated by combining the configuration of the memory system 200 shown in FIG. 7 and the bank access operation in the memory system 400 of the third embodiment outlined below, making it is possible to provide a memory cell access method with no apparent delay.

Figure 15:
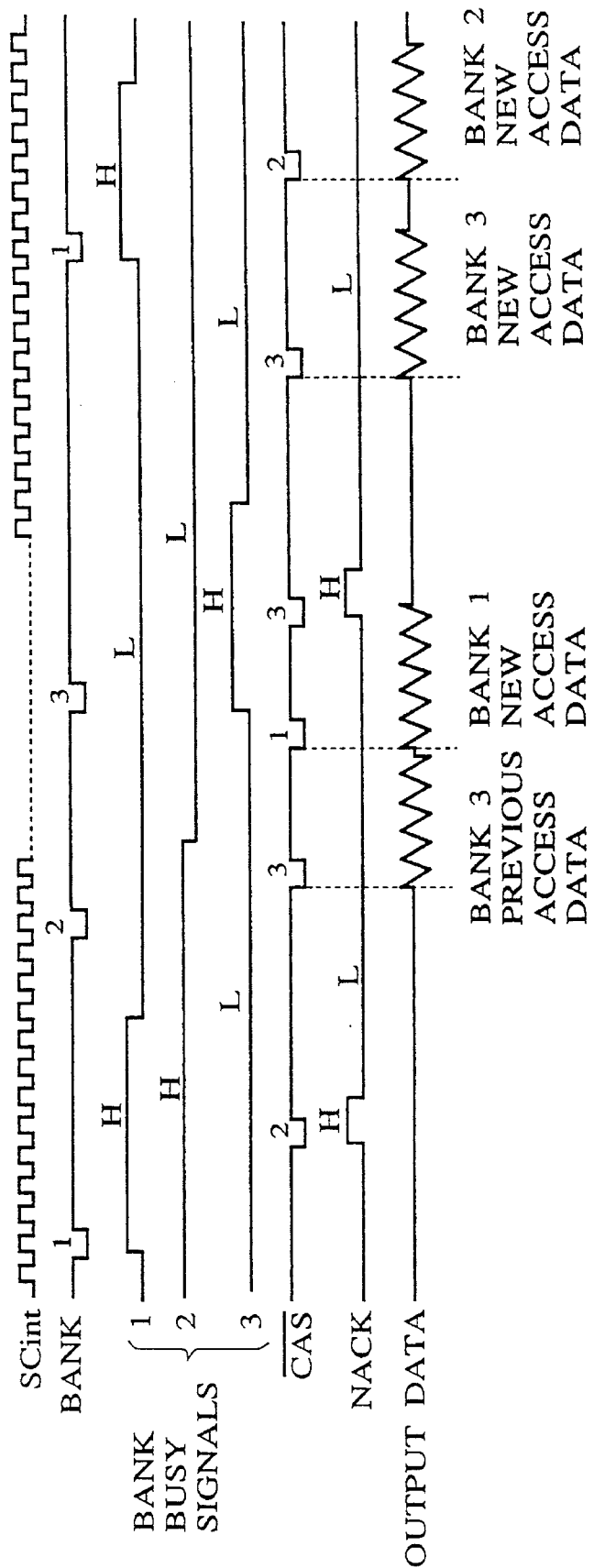
FIG. 15 is a timing chart for explaining the operation of the multi-bank memory system shown in FIG. 14.

FIG. 15 is a timing chart for explaining the bank access operation in the memory system 400 of the third embodiment.

In FIG. 15 the BANK signal determines which bank is activated (operated).

For example, in the case where a different row is a certain selected bank is to be accessed continuously, the data in the memory cell belonging to the row which had been selected immediately before this is must be refreshed, that is, rewritten, in the same memory cell, after which it is necessary to select a new row in the same bank, in the same manner as in the operations explained for the memory system 100 of the first embodiment of FIG. 2 and the memory system 200 of the second embodiment of FIG. 7.

For example, the longest access time is required in the case where the deepest stack belonging to a certain row in a certain bank has been selected, after which the deepest stack belonging to another row in the same bank is selected.

Next, FIG. 15 shows the condition where the access operation for the bank which is to be accessed has not yet been completed while a bank busy signal (in FIG. 15, the control signals for the banks 1, 2, 3 are bank busy signals 1, 2, 3 respectively) is at the high level ("H").

When the bankbusy signal is at the low level ("L"), the data in the memory cell in any corresponding bank is latched in the sense amplifier (S/A), and can immediately be transferred in a column access operation.

In this manner, when a new request is happened to access a memory cell in the same bank, if the bankbusy signal is at the high level ("H"), either a non-selected state is indicated until a new bank is selected, or, a restore operation or the like is performed under the selected state up to that time, or, an operation is carried out to hold data, which is in a deep stack or in a restore register, in the sense amplifier (S/A).

The length of the period during which the bankbusy signal is at high level varies according to the type of access operation.

A control signal /CAS command designates a certain bank. This is a command for showing a head address for one series of column access and commencing access to that bank. In the timing chart shown in FIG. 15, the number in the /CAS command indicates the specified bank.

If the designated bank is in busy, that bank transmits a NACK signal to an external destination and shows that the /CAS command has not been received.

In this case, the /CAS command is transmitted to another bank, or the /CAS command may be continuously transmitted until this command is received by the original bank.

Then the data latched in the sense amplifier (S/A) is transmitted in synchronism with the clock signal SCint.

In this manner, in the memory system 400 of the bank configuration of this embodiment, the activation of each bank and the access of the row can be implemented independent of a column access operation for transferring data. Specifically, during the output of data from one bank it is possible to carry out an operation wherein there is a wide variation in access time for another bank. More efficient data transmission can be provided in the memory of the memory system with a cascade-type cell structure which requires time for row access.

An explanation will now be given for the case where the above-mentioned memory system 400 with the multi-bank configuration is arranged as a matrix and a memory array is formed.

Figure 16:
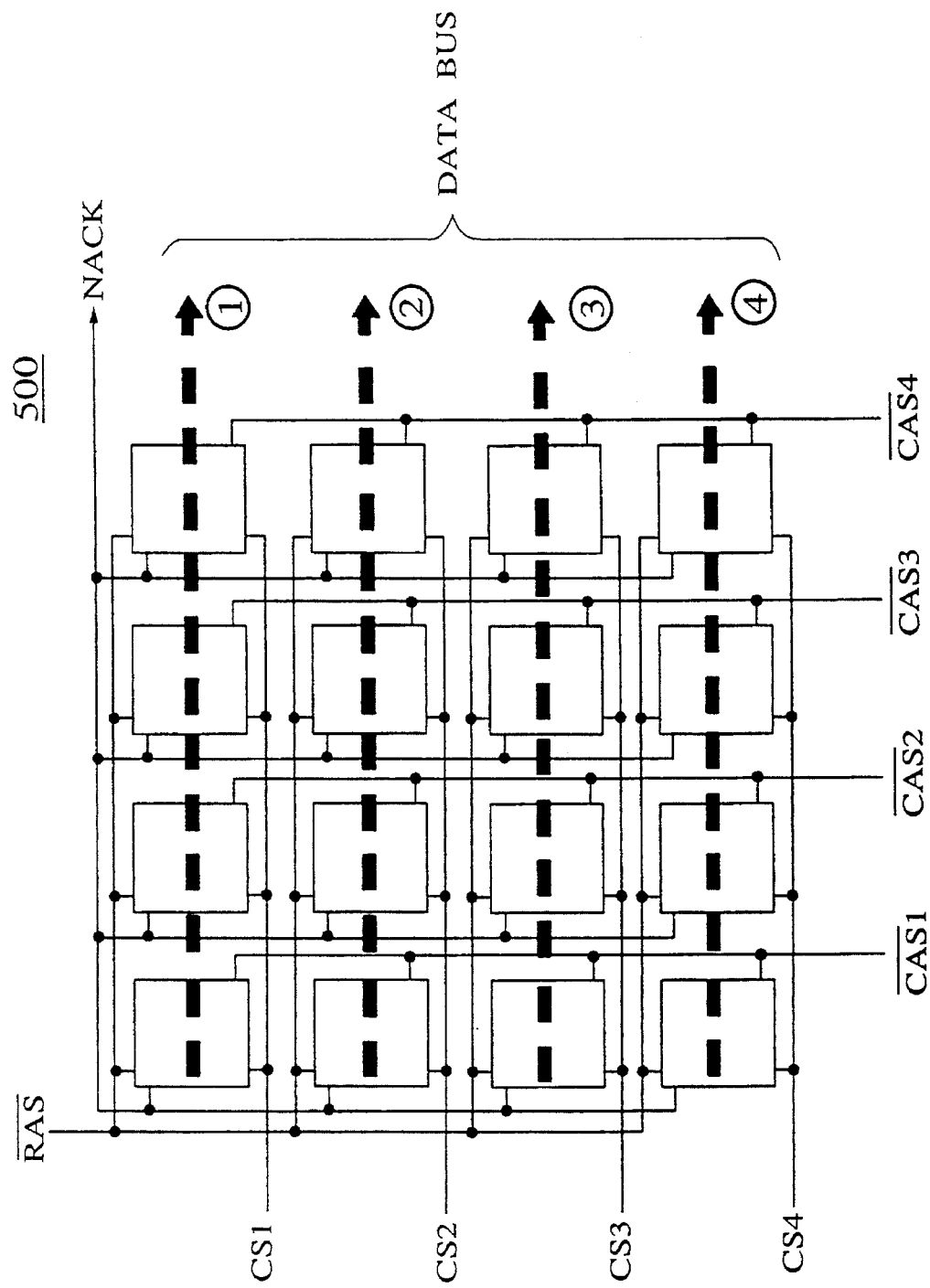
FIG. 16 is a drawing of a memory system obtained by arranging the memory system of the multi-bank configuration shown in FIG. 14 in matrix form.

A memory system 500 shown in FIG. 16 is arranged in a matrix formed from 16 chips to form a memory array. A control signal /RAS for designating the selection of the bank is transmitted to all the chips in common.

Accordingly, the control signal NACK which shows that the bank is in a bankbusy state is also transmitted from all the chips in common.

A control signal CS (CS1, CS2, CS3, CS4) showing that the command is valid for the chip, is supplied to each chip independently in each row.

Only the levels of the control signals /RAS and /CAS in the clock cycle when the control signal CS is at the high level ("H") are valid as commands or data.

The control signal /CAS which is a command for column access is supplied independently at each chip column. The independent control signals are differentiated by having numbers attached, such as /CAS1, /CAS2, /CAS3, /CAS4.

A data bus is provided in common for the chip which forms the rows. The data bus of each row is connected in common at the outside of the chip array.

For example, in accessing a bank in any row, specifically, in activating the chip, the control signal /RAS is switched to the low level and is provided with data which specifies the bank and the address for the row/stack/track. Also, a control signal CS for the row to be activated is switched to the high level.

Simultaneously, a plurality of rows may be activated, specifically, by switching a plurality of signals CS to the high level at the same time. In the activated rows and banks, these rows and banks are activated according to the sensing method for the cascade-type cell shown in the first embodiment, data is stored in the sense amplifier (S/A) to prepare a column access operation.

For column access, only one signal /CAS for the accessed column and the control signal CS specifying one row are selected and to provide a command.

When the columns of two or more rows are selected, data on the data bus is interfered with, causing erroneous operation.

If the bank for which column access has been designated is not yet activated, the bank returns a NACK signal.

If the memory array has this type of function, a number of banks can be activated in advance, prior to access, so that the hit ratio for column access of the necessary data is increased. Accordingly, the efficiency of data transmission is greatly increased even when accessing a memory cell with a cascade-type cell structure. Next, in a memory system which has a multiple bank structure of a memory array structure or the like, a data access sequence, which is effective in sensing the memory cell of a cascade-type cell structure for which there is a wide variation in the amount of time for activating the bank, is shown in FIG. 19.

Figure 19:
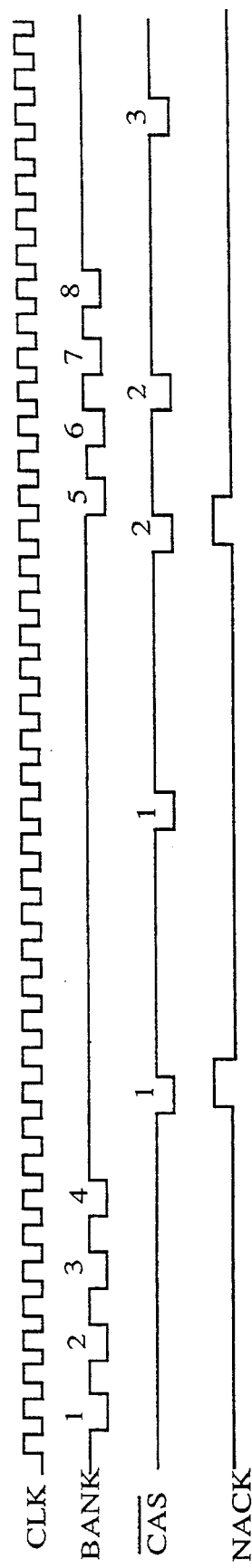
FIG. 19 is a timing chart for the sequence flow of the operation of a multi-bank system made up of the memory system with the multi-bank configuration shown in FIG. 14.

In FIG. 19, first, banks which can be activated independently is divided into at least two groups. In FIG. 19, there are two bank groups, specifically, banks 1, 2, 3, 4 and banks 5, 6, 7, 8.

First, the first bank group (banks 1, 2, 3, 4) is activated without a column access operation.

Next, column access operation to the first bank group (banks 1, 2, 3, 4) is gradually implemented. During this data transmission, the second bank group (banks 5, 6, 7, 8) is activated.

In column access, if a NACK signal is returned from a certain memory bank, a control command for column access continues to be transmitted until access to this bank is accepted, so that there is no disruption to the data transmission sequence.

In FIG. 19, the number stated at the point where the /CAS command is switched to the low level is the number of the bank of which the column is accessed.

Figure 17:
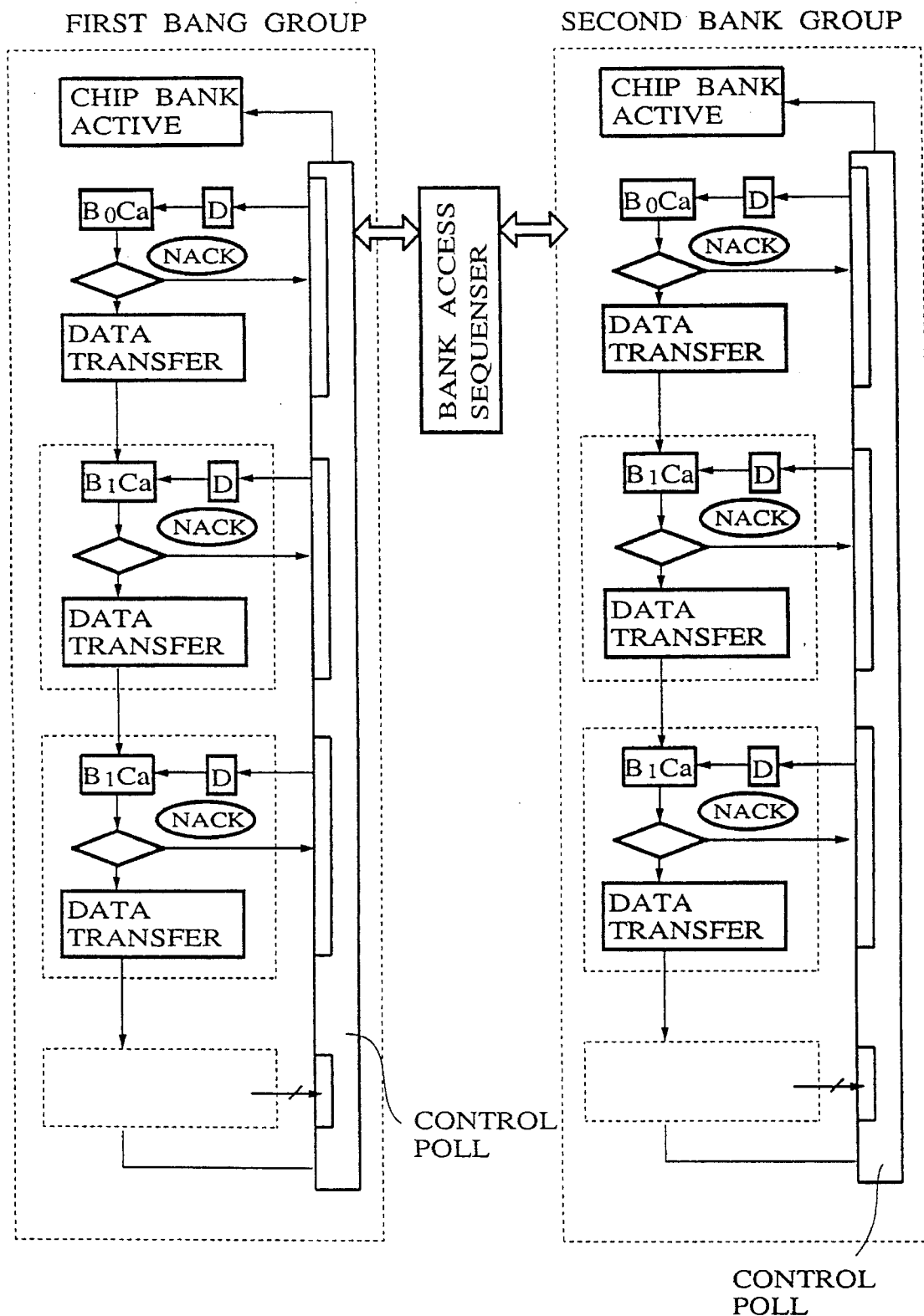
FIG. 17 is a conceptual drawing showing the sequence flow of the operation of a timing chart shown in FIG. 20.

FIG. 17 is a drawing in which the sequence of the column access shown in FIG. 19 is presented in block form.

This access method shown in FIG. 19 is suitable for use in the high speed transmission of large amounts of data. When the address to be accessed is known in advance, it is possible to activate the bank in advance, therefore this is an effectively operating, efficient data access method.

In the memory system shown in FIG. 17, the bank is divided into two groups. This is not limited to the present invention. For example two or more or any other number is acceptable. The access is possible in this case also because the drawback of a wide variation in the amount of time required for memory cell access characteristic to a cascade-type cell is not evident.

In FIG. 17, BOCa, B1Cb, and the like designate the head address for column access corresponding to the respective banks. Also, D indicates a specified amount of delay. When a control signal NACK is received from a certain bank, column access is once again carried out for the same bank after the specified delay time has elapsed.

Figure 18:
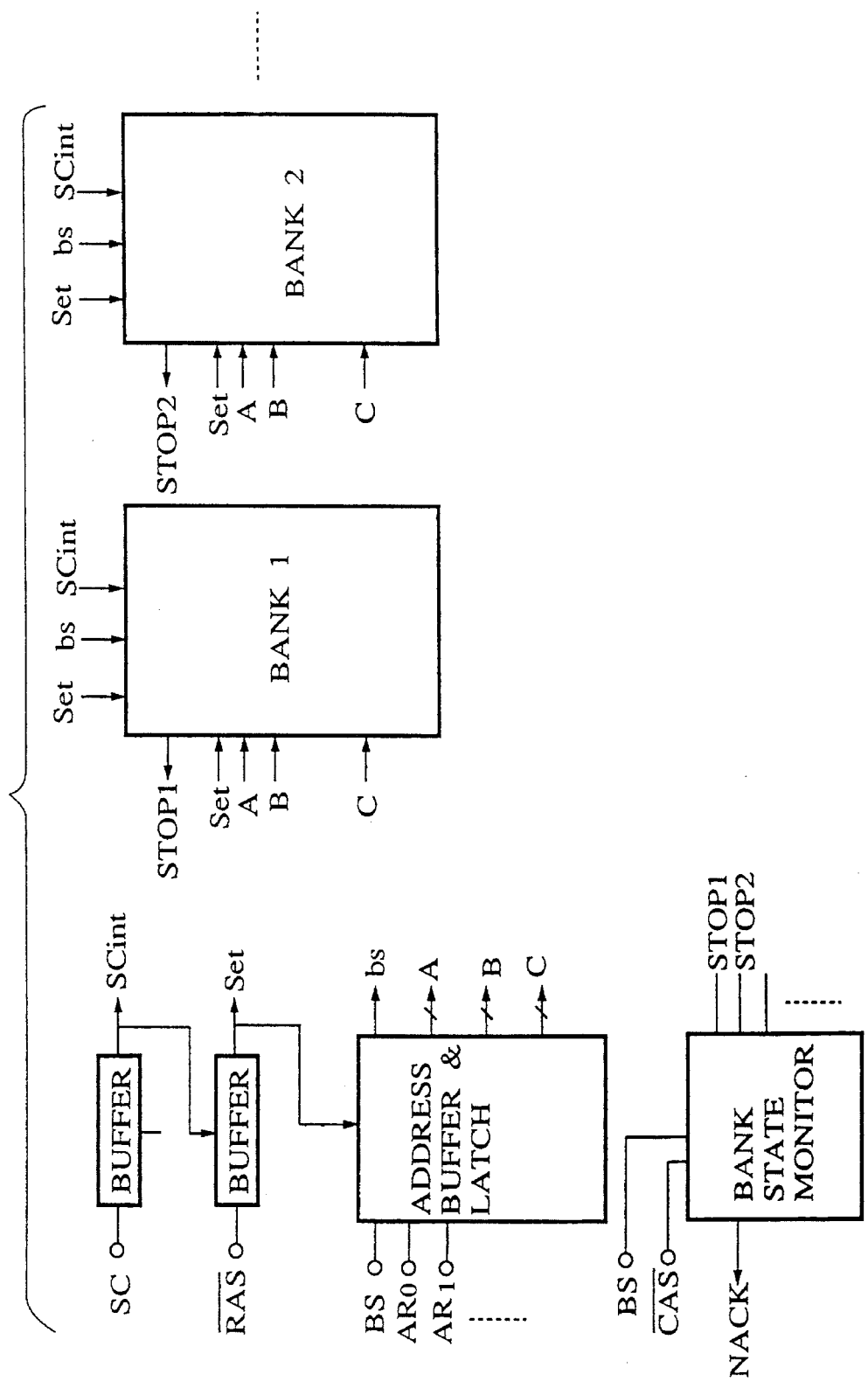
FIG. 18 is a drawing for explaining the input and output of control signals and the like in the multi-bank memory system shown in FIG. 14.

FIG. 18 is a drawing for explaining the transmission clock signal CK and the control signal STOP explained for the memory system 200 of the second embodiment, and for explaining the operation of each bank in the memory system of the multi-bank structure of the third embodiment.

In FIG. 18, after the data in the memory cell to be accessed in each bank has been sensed in the sense amplifier (S/A), and when the data transmission started for the restore register corresponding to the memory cell with a cascade-type cell structure has been completed, a stop signal is transmitted externally from that bank. Accordingly, when the stop signal STOP from the bank selected by both of the /CAS signal for column access and the bank selection signal BS are not emitted by a bank state monitor section, the control signal NACK is switched to the high level ("H"), and any new column access to that bank is halted.

As explained above, in the synchronous memory system with a cascade-type structure of the present invention, the access operation for the cascade-connected memory cells is performed in accordance with the clock signal CK obtained by dividing a clock signal for entering an address signal for the memory cell to be accessed. Therefore, it is not necessary to once again use a clock signal to control the data transmission operation. In addition, until the data in the object memory cell is generated to the sense amplifier from the entered address signal, one string of operations is performed in synchronism with the clock signal CK. Therefore, it is possible to access the memory with good efficiency, without the necessity of the I/O timing being supervised by a CPU or the like.

In addition, the access method in the synchronous memory system with a cascade-type structure of the present invention has a multi-bank structure, and during access to one bank, a preparation operation can be implemented independently for accessing another bank. Therefore, it is possible to avoid showing a wide variation in access time, and high speed access can be implemented.

While the above provides a full and complete disclosure of the preferred embodiments of the present invention, various modifications, alternative constructions and equivalents my be employed without departing from the true spirit and scope of the invention. Therefore the above description and illustration should not be constructed as limiting the scope of the invention, which is defined by the appended claims.

What is claimed is:

1. A synchronous memory system with a cascade-type memory cell structure for receiving address signals for a memory cell to be accessed and reading out of data stored in the memory cell being performed in synchronization with a first clock signal supplied from an external device, the synchronous memory system comprising:

a plurality of bit lines;

a plurality of memory cells having a cascade-type configuration connected to each of the plurality of bit lines;

a plurality of word lines connected to the plurality of memory cells; and a row decoder comprising:

a plurality of first decode circuits for receiving a first row address signal and decoding the first row address signal and generating a first drive control signal, each first decode circuit comprising a first PMOS precharging transistor and first NMOS discharging transistors connected in series;

a plurality of word line drive units for receiving the first drive control signal and providing a first drive signal to the plurality of word lines, each first drive unit having a first PMOS transistor and a first NMOS transistor connected in series, an intermediate node between the first PMOS transistor and the first NMOS transistor belonging to one the plurality of word lines; and a voltage generation circuit for receiving a first voltage and a second row address signal, and generating second drive signals and providing the second drive signals to the first PMOS transistor of each of the plurality of word line drive units according to the second row address signal.

2. A synchronous memory system with a cascade-type memory cell structure as claimed in claim 1, wherein the voltage generation circuit comprises a plurality of second decode circuits, a plurality of second drive units, a plurality of first inverters, and a second voltage generation circuit, wherein the second voltage generation circuit receives the first voltage and boosts up the first voltage to the second voltage, the plurality of second decode circuits receive the second row address signal, generate a second drive control signal, and provide the second drive control signal to the plurality of second drive units, each of the plurality of second decode circuits comprise a second PMOS precharging transistor and second NMOS discharging transistors connected in series, a source of the second precharging transistor is connected to the second voltage provided from the second voltage generation circuit, the plurality of second drive units receive the second drive control signal and supply the second drive signals to the first PMOS transistors in the plurality of word line drive units, each second drive unit has a second PMOS transistor whose source being connected to the second voltage provided from the second voltage generation circuit and a second NMOS transistor connected in series, an intermediate node between the second PMOS transistor and the second NMOS transistor in each second drive unit is connected to the first inverter, and each of the plurality of first inverters receives the second drive signal and generates a third drive signal, each first inverter is driven based on the first voltage.

3. A synchronous memory system with a cascade-type memory cell structure as claimed in claim 2, wherein the row decoder further comprises a plurality of third NMOS transistors, a source of each third NMOS transistor is connected to each word line, a gate of each third NMOS transistor is connected to each of the plurality of first inverters.

4. A synchronous memory system with a cascade-type memory cell structure as claimed in claim 3, wherein a voltage potential of the first voltage is smaller than a voltage potential of the second voltage.

5. A synchronous memory system with a cascade-type memory cell structure for receiving address signals for a memory cell to be accessed and reading out of data stored in the memory cell being performed in synchronization with a first clock signal supplied from an external device, the synchronous memory system comprising:

a plurality of bit lines;

a plurality of memory cells having a cascade-type configuration connected to each of the plurality of bit lines;

a plurality of word lines connected to the plurality of memory cells; and a row decoder comprising:

a plurality of first decode circuits for receiving a first row address signal and decoding the first row address signal and generating a first drive control signal, each first decode circuit comprising a first PMOS precharging transistor and first NMOS discharging transistors connected in series;

a plurality of word line drive units for receiving the first drive control signal and providing a first drive signal to the plurality of word lines, each first drive unit having a first NMOS transistor and a second NMOS transistor connected in series, an intermediate node between the first NMOS transistor and the second NMOS transistor belonging to one the plurality of word lines;

a plurality of first flip/flop circuits (F/Fs) for storing the first drive control signal, each first F/F being located between each first decode circuit and each word line drive unit, each first F/F comprising second and third inverters connected in series, each first F/F being driven by the first voltage;

a plurality of fourth inverters, each fourth inverter placed between each first F/F and each word line drive unit, each fourth inverter driven by the first voltage; and a voltage generation circuit for receiving a first voltage and a second row address signal, and generating second drive signals and providing the second drive signals to the first NMOS transistor of each of the plurality of word line drive units according to the second row address signal.

6. A synchronous memory system with a cascade-type memory cell structure as claimed in claim 5, wherein the voltage generation circuit comprises a plurality of second decode circuits, a plurality of second flip/flop circuits (F/Fs), a plurality of seventh inverters, a plurality of second drive units, a plurality of first inverters, and a second voltage generation circuit, wherein the second voltage generation circuit receives the first voltage and boosts up the first voltage to the second voltage, the plurality of second decode circuits receive the second row address signal, generate a second drive control signal, and provide the second drive control signal to the plurality of second drive units, each of the plurality of second decode circuits comprises a second PMOS precharging transistor and second NMOS discharging transistors connected in series, a source of the second precharging transistor is connected to the second voltage provided from the second voltage generation circuit, the plurality of second flip/flop circuits (F/Fs) located between each second decode circuit and the second drive unit, each second F/F comprises fifth and sixth inverters connected in series, each second F/F being driven by the first voltage;

the plurality of seventh inverters, each seventh inverter located between each second F/F and each second drive unit, each seventh inverter driven by the first voltage; and the plurality of second drive units receive the second driven control signal and supply the second drive signals to the first NMOS transistors in the plurality of word line drive units, each second drive unit has a third NMOS transistor whose source being connected to the first voltage provided from the second voltage generation circuit and a fourth NMOS transistor connected in series, an intermediate node between the third NMOS transistor and the fourth NMOS transistor in each second drive unit is connected to the first inverter, and each of the plurality of first inverters receives the second drive signal and generates a third drive signal, each first inverter is driven based on the first voltage.

7. A synchronous memory system with a cascade-type memory cell structure as claimed in claim 6, wherein the row decoder further comprises a plurality of fifth NMOS transistors, a source of each fifth NMOS transistor is connected to each word line, a gate of each fifth NMOS transistor is connected to each of the plurality of first inverters.

8. A synchronous memory system with a cascade-type memory cell structure as claimed in claim 7, wherein a voltage potential of the first voltage is smaller than a voltage potential of the second voltage.

9. A synchronous memory system with a cascade-type memory cell structure for receiving address signals for a memory cell to be accessed and reading out of data stored in the memory cell being performed in synchronization with a first clock signal supplied from an external device, the synchronous memory system comprising:

a plurality of bit lines;

a plurality of memory cells having a cascade-type configuration connected to each of the plurality of bit lines;

a plurality of word lines connected to the plurality of memory cells; and a row decoder comprising:

a plurality of first decode circuits for receiving a first row address signal and decoding the first row address signal and generating a first drive control signal, each first decode circuit comprising a first PMOS precharging transistor and first NMOS discharging transistors connected in series;

a plurality of first flip/flop circuits (F/Fs) for storing the first drive control signal, each first F/F being located between each first decode circuit and each word line drive unit, each first F/F comprising second and third inverters connected in series;

a plurality of fourth inverters, each fourth inverter placed between each first F/F and each word line drive unit; and a plurality of word line drive units for receiving the first drive control signal and providing a first drive signal to the plurality of word lines, each first drive unit having a first PMOS transistor and a first NMOS transistor connected in series, an intermediate node between the first PMOS transistor and the first NMOS transistor belonging to one the plurality of word lines; and a voltage generation circuit for receiving a first voltage and a second row address signal, generating second drive signals and providing the second drive signals to the first PMOS transistor of each of the plurality of word line drive units according to the second row address signal, and boosting up the first voltage to a second voltage, wherein the first PMOS precharging transistor in each first decode circuit, the second and third inverters in each first F/F, each fourth inverter are driven by the second voltage.

10. A synchronous memory system with a cascade-type memory cell structure as claimed in claim 9, wherein the voltage generation circuit comprises a plurality of second decode circuits, a plurality of second flip/flop circuits (F/Fs), a plurality of seventh inverters, a plurality of second drive units, a plurality of first inverters, and a second voltage generation circuit, wherein the second voltage generation circuit receives the first voltage and boosts up the first voltage to the second voltage, the plurality of second decode circuits receive the second row address signal, generate a second drive control signal, and provide the second drive control signal to the plurality of second drive units, each of the plurality of second decode circuits comprises a second PMOS precharging transistor and second NMOS discharging transistors connected in series, a source of the second precharging transistor is connected to the second voltage provided from the second voltage generation circuit, the plurality of second flip/flop circuits (F/Fs) located between each second decode circuit and the second drive unit, each second F/F comprises fifth and sixth inverters connected in series, each second F/F being driven by the second voltage;

the plurality of seventh inverters, each seventh inverter located between each second F/F and each second drive unit, each seventh inverter driven by the second voltage; and the plurality of second drive units receive the second drive control signal and supply the second drive signals to the first PMOS transistors in the plurality of word line drive units, each second drive unit has a second PMOS transistor whose source being connected to the second voltage provided from the second voltage generation circuit and a second NMOS transistor connected in series, an intermediate node between the second PMOS transistor and the second NMOS transistor in each second drive unit is connected to the first inverter, and each of the plurality of first inverters receives the second drive signal and generates a third drive signal, each first inverter is driven based on the first voltage.

11. A synchronous memory system with a cascade-type memory cell structure as claimed in claim 10, wherein the row decoder further comprises a plurality of third NMOS transistors, a source of each third NMOS transistor is connected to each word line, a gate of each third NMOS transistor is connected to each of the plurality of first inverters.

12. A synchronous memory system with a cascade-type memory cell structure as claimed in claim 11, wherein a voltage potential of the first voltage is smaller than a voltage potential of the second voltage.

13. A synchronous memory system with a cascade-type memory cell structure in which receiving of an address for a memory cell to be accessed and readout of data stored from the memory cell being performed in synchronization with a first clock signal supplied externally, the synchronous memory system comprising:

a plurality of word lines;

a plurality of bit lines;

a plurality of first memory cells having a cascade-type configuration connected to the plurality of word lines, the plurality of first memory cells forming a memory cell group in a plurality of memory cell groups in a memory cell array, the memory cell group being connected to one of the plurality of bit lines;

a plurality of transfer gates provided to each of the plurality of the bit lines to connect each memory cell group to each of the plurality of the bit lines;

a sense amplifier connected to each of the plurality of bit lines for sensing data to be written into each of the plurality of first memory cells or for sensing data to be read out from each of the plurality of first memory cells;

an equalizer provided for the sense amplifier for equalizing a voltage potential of each of the plurality of bit lines;

a plurality of second memory cells located between the plurality of first memory cells and the sense amplifier, the plurality of second memory cells provided for the plurality of first memory cells;

a selector for receiving an address signal of a target memory cell to be accessed in the plurality of first memory cells according to the first clock signal, selecting each of the plurality of first memory cells while saving data of the selected each of the plurality of first memory cells to the plurality of second memory cells in synchronism with the first clock signal and counting a number of the selected each of the plurality of first memory cells, generating a sense operation halt control signal when the target memory cell being selected and whose data being stored to the sense amplifier, and transmitting the sense operation halt control signal externally; and a decoder for receiving the address signal of the target memory cell and generates access control signals for controlling operations of the plurality of first memory cells, the plurality of transfer gates, the sense amplifier, the equalizer, and the plurality of second memory cells, and transmits the address control signals to the plurality of word lines, the plurality of transfer gates, the plurality of second memory cells, and the sense amplifier, wherein when a memory cell in the plurality of first memory cells in another memory cell group connected is a target memory cell to be accessed in series, a sense operation for the first memory cells including the target memory cell in another memory cell group is executed after the data items temporarily have been saved into the plurality of second memory cells are restored into corresponding the plurality of first memory cells including the preceding target memory cell.

14. A synchronous memory system with a cascade-type memory cell structure as claimed in claim 13, wherein the number of the plurality of first memory cells in each memory cell group is four first memory cells.

15. A synchronous memory system with a cascade-type memory cell structure as claimed in claim 13, wherein the number of the plurality of first memory cells in each memory cell group is sixteen first memory cells.

16. A synchronous memory system with a cascade-type memory cells as claimed in claim 13, wherein the selector generates a control signal to select each of the plurality of first memory cells including the target memory cell based on the address designating the target memory cell, transmitting the control signal to the decoder, and generating a stop signal in order to halt the sense operation for the plurality of first memory cells when the transmission of data stored in the target memory cell to the sense amplifier is completed, and transmits the stop signal to the decoder and external devices.

17. A synchronous memory system with a cascade-type memory cells as claimed in claim 13, wherein the equalizer comprises first and second transistors connected in series provided to each of the plurality of bit lines, and a third transistor connected to each of the plurality of bit lines, and gates of the first, the second, and the third transistors are connected to each other and an intermediate point between the first transistor and the second transistor is connected to a power source.

18. A synchronous memory system with a cascade-type memory cells as claimed in claim 13, wherein the sense amplifier comprises a first type MOS transistor pair connected in series and a second type MOS transistor pair connected in series, the first type MOS transistor pair and the second type MOS transistor pair are connected to the bit selection line pair in parallel, both gates of the first type MOS transistor pair are connected to the bit selection line and both gates of the second type MOS transistor pair are connected to the bit selection line.

19. A synchronous memory system with a cascade-type memory cells as claimed in claim 13,
wherein the plurality of first memory cells are arranged in rows and columns, and
the selector comprises:
a first counter for counting a row position in the rows, generating a row position signal according to the row position;
a second counter for counting a column position in the columns, generating a column position signal according to the column position; and
a comparator for comparing the row position signal and the column position signal with a target position signal according to the address of the target memory cell, and generates the sense operation halt control signal externally if the row position signal and the column position signal are agree with the target position signal.

20. A synchronous memory system with a cascade-type memory cells as claimed in claim 13, wherein each transfer gate in the plurality of transfer gates comprises a MOS transistor pair whose gates are connected to the selector.

21. A synchronous memory system with a cascade-type memory cell structure as claimed in claim 13, wherein the decoder comprises a row decoder,
the row decoder comprises:
a plurality of first decode circuits for receiving a first row address signal and decoding the first row address signal and generating a first drive control signal, each first decode circuit comprising a first PMOS precharging transistor and first NMOS discharging transistors connected in series;
a plurality of word line drive units for receiving the first drive control signal and providing a first drive signal to the plurality of word lines, each first drive unit having a first PMOS transistor and a first NMOS transistor connected in series, an intermediate node between the first PMOS transistor and the first NMOS transistor belonging to one the plurality of word lines; and
a voltage generation circuit for receiving a first voltage and a second row address signal, and generating second drive signals and providing the second drive signals to the first PMOS transistor of each of the plurality of word line drive units according to the second row address signal.

22. A synchronous memory system with a cascade-type memory cell structure as claimed in claim 21, wherein the voltage generation circuit comprises a plurality of second decode circuits, a plurality of second drive units, a plurality of first inverters, and a second voltage generation circuit,
wherein
the second voltage generation circuit receives the first voltage and boosts up the first voltage to the second voltage,
the plurality of second decode circuits receive the second row address signal, generate a second drive control signal, and provide the second drive control signal to the plurality of second drive units, each of the plurality of second decode circuits comprises a second PMOS precharging transistor and second NMOS discharging transistors connected in series, a source of the second precharging transistor is connected to the second voltage provided from the second voltage generation circuit,
the plurality of second drive units receive the second drive control signal and supply the second drive signals to the first PMOS transistors in the plurality of word line drive units, each second drive unit has a second PMOS transistor whose source being connected to the second voltage provided from the second voltage generation circuit and a second NMOS transistor connected in series, an intermediate node between the second PMOS transistor and the second NMOS transistor in each second drive unit is connected to the first inverter, and
each of the plurality of first inverters receives the second drive signal and generates a third drive signal, each first inverter is driven based on the first voltage.

23. A synchronous memory system with a cascade-type memory cell structure as claimed in claim 22, wherein the row decoder further comprises a plurality of third NMOS transistors, a source of each third NMOS transistor is connected to each word line, a gate of each third NMOS transistor is connected to each of the plurality of first inverters.

24. A synchronous memory system with a cascade-type memory cell structure as claimed in claim 23, wherein a voltage potential of the first voltage is smaller than a voltage potential of the second voltage.

25. A synchronous memory system with a cascade-type memory cell structure as claimed in claim 23, wherein the decoder comprises a row decoder, the row decoder comprises:
a plurality of first decode circuits for receiving a first row address signal and decoding the first row address signal and generating a first drive control signal, each first decode circuit comprising a first PMOS precharging transistor and first NMOS discharging transistors connected in series;
a plurality of word line drive units for receiving the first drive control signal and providing a first drive signal to the plurality of word lines, each first drive unit having a first NMOS transistor and a second NMOS transistor connected in series, an intermediate node between the first NMOS transistor and the second NMOS transistor belonging to one the plurality of word lines;
a plurality of first flip/flop circuits (F/Fs) for storing the first drive control signal, each first F/F being located between each first decode circuit and each word line drive unit, each first F/F comprising second and third inverters connected in series, each first F/F being driven by the first voltage;
a plurality of fourth inverters, each fourth inverter placed between each first F/F and each word line drive unit, each fourth inverter driven by the first voltage; and
a voltage generation circuit for receiving a first voltage and a second row address signal, and generating second drive signals and providing the second drive signals to the first NMOS transistor of each of the plurality of word line drive units according to the second row address signal.

26. A synchronous memory system with a cascade-type memory cell structure as claimed in claim 25, wherein the voltage generation circuit comprises a plurality of second decode circuits, a plurality of second flip/flop circuits (F/Fs), a plurality of seventh inverters, a plurality of second drive units, a plurality of first inverters, and a second voltage generation circuit, wherein
the second voltage generation circuit receives the first voltage and boosts up the first voltage to the second voltage,
the plurality of second decode circuits receive the second row address signal, generate a second drive control signal, and provide the second drive control signal to the plurality of second drive units, each of the plurality of second decode circuits comprises a second PMOS precharging transistor and second NMOS discharging transistors connected in series, a source of the second precharging transistor is connected to the second voltage provided from the second voltage generation circuit,
the plurality of second flip/flop circuits (F/Fs) located between each second decode circuit and the second drive unit, each second F/F comprises fifth and sixth inverters connected in series, each second F/F being driven by the first voltage;
the plurality of seventh inverters, each seventh inverter located between each second F/F and each second drive unit, each seventh inverter driven by the first voltage; and
the plurality of second drive units receive the second drive control signal and supply the second drive signals to the first NMOS transistors in the plurality of word line drive units, each second drive unit has a third NMOS transistor whose source being connected to the first voltage provided from the second voltage generation circuit and a fourth NMOS transistor connected in series, an intermediate node between the third NMOS transistor and the fourth NMOS transistor in each second drive unit is connected to the first inverter, and
each of the plurality of first inverters receives the second drive signal and generates a third drive signal, each first inverter is driven based on the first voltage.

27. A synchronous memory system with a cascade-type memory cell structure as claimed in claim 26, wherein the row decoder further comprises a plurality of fifth NMOS transistors, a source of each fifth NMOS transistor is connected to each word line, a gate of each fifth NMOS transistor is connected to each of the plurality of first inverters.

28. A synchronous memory system with a cascade-type memory cell structure as claimed in claim 27, wherein a voltage potential of the first voltage is smaller than a voltage potential of the second voltage.

29. A synchronous memory system with a cascade-type memory cell structure as claimed in claim 13, wherein the decoder comprises a row decoder, the row decoder comprises:
a plurality of first decode circuits for receiving a first row address signal and decoding the first row address signal and generating a first drive control signal, each first decode circuit comprising a first PMOS precharging transistor and first NMOS discharging transistors connected in series;
a plurality of first flip/flop circuits (F/Fs) for storing the first drive control signal, each first F/F being located between each first decode circuit and each word line drive unit, each first F/F comprising second and third inverters connected in series;
a plurality of fourth inverters, each fourth inverter placed between each first F/F and each word line drive unit; and
a plurality of word line drive units for receiving the first drive control signal and providing a first drive signal to the plurality of word lines, each first drive unit having a first PMOS transistor and a first NMOS transistor connected in series, an intermediate node between the first PMOS transistor and the first NMOS transistor belonging to one the plurality of word lines; and
a voltage generation circuit for receiving a first voltage and a second row address signal, generating second drive signals and providing the second drive signals to the first PMOS transistor of each of the plurality of word line drive units according to the second row address signal, and boosting up the first voltage to a second voltage,
wherein the first PMOS precharging transistor in each first decode circuit, the second and third inverters in each first F/F, each fourth inverter are driven by the second voltage.

30. A synchronous memory system with a cascade-type memory cell structure as claimed in claim 29, wherein the voltage generation circuit comprises a plurality of second decode circuits, a plurality of second flip/flop circuits (F/Fs), a plurality of seventh inverters, a plurality of second drive units, a plurality of first inverters, and a second voltage generation circuit, wherein
the second voltage generation circuit receives the first voltage and boosts up the first voltage to the second voltage, the plurality of second decode circuits receive the second row address signal, generate a second drive control signal, and provide the second drive control signal to the plurality of second drive units, each of the plurality of second decode circuits comprises a second PMOS precharging transistor and second NMOS discharging transistors connected in series, a source of the second precharging transistor is connected to the second voltage provided from the second voltage generation circuit, the plurality of second flip/flop circuits (F/Fs) located between each second decode circuit and the second drive unit, each second F/F comprises fifth and sixth inverters connected in series, each second F/F being driven by the second voltage;

the plurality of seventh inverters, each seventh inverter located between each second F/F and each second drive unit, each seventh inverter driven by the second voltage; and the plurality of second drive units receive the second drive control signal and supply the second drive signals to the first PMOS transistors in the plurality of word line drive units, each second drive unit has a second PMOS transistor whose source being connected to the second voltage provided from the second voltage generation circuit and a second NMOS transistor connected is series, an intermediate node between the second PMOS transistor and the second NMOS transistor in each second drive unit is connected to the first inverter, and each of the plurality of first inverters receives the second drive signal and generates a third drive signal, each first inverter is driven based on the first voltage.

31. A synchronous memory system with a cascade-type memory cell structure as claimed in claim 30, wherein the row decoder further comprises a plurality of third NMOS transistors, a source of each third NMOS transistor is connected to each word line, a gate of each third NMOS transistor is connected to each of the plurality of first inverters.

32. A synchronous memory system with a cascade-type memory cell structure as claimed in claim 31, wherein a voltage potential of the first voltage is smaller than a voltage potential of the second voltage.

\* \* \* \* \*